(12) United States Patent
Natori et al.

(10) Patent No.: US 7,714,373 B2
(45) Date of Patent: May 11, 2010

(54) SEMICONDUCTOR DEVICE AND METHOD OF MANUFACTURING THE SAME

(75) Inventors: Katsuaki Natori, Yokohama (JP);
Masayuki Tanaka, Yokohama (JP);
Katsuyuki Sekine, Yokohama (JP);
Hirokazu Ishida, Yokohama (JP);
Masumi Matsuzaki, Yokohama (JP);
Yoshio Ozawa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 103 days.

(21) Appl. No.: 11/822,437

(22) Filed: Jul. 5, 2007

(65) Prior Publication Data
US 2008/0017914 A1    Jan. 24, 2008

(30) Foreign Application Priority Data
Jul. 5, 2006    (JP)    ............... 2006-186040

(51) Int. Cl.
*H01L 29/788*    (2006.01)
(52) U.S. Cl. ............ 257/314; 257/315; 257/261; 257/E29.129; 257/E29.3; 257/E21.179; 257/E21.422
(58) Field of Classification Search ............... 257/314, 257/315, 261, E29.129, E29.3, E21.179, 257/E21.422
See application file for complete search history.

(56) References Cited

U.S. PATENT DOCUMENTS

2004/0135186 A1*    7/2004    Yamamoto ............... 257/296
2005/0212036 A1*    9/2005    Tanaka et al. ............. 257/316
2005/0247988 A1*    11/2005    Yoshida et al. ............. 257/411
2006/0014343 A1*    1/2006    Kundalgurki .............. 438/238
2006/0027882 A1    2/2006    Mokhlesi
2006/0094188 A1    5/2006    Kim et al.
2006/0255396 A1    11/2006    Nara
2006/0273320 A1    12/2006    Natori et al.
2007/0063266 A1    3/2007    Natori et al.

FOREIGN PATENT DOCUMENTS

| JP | 2003-7861 | 1/2003 |
|---|---|---|
| KR | 10-2004-0006465 | 1/2004 |
| KR | 10-2004-0080291 | 9/2004 |

OTHER PUBLICATIONS

Korean Patent Office Notification for Filing Opinion issued in corresponding Application No. 10-2007-67121 mailed Apr. 15, 2009, and English language translation thereof.

Korean Patent Office Notification for Filing Opinion issued in copending Application No. 10-2007-67121 mailed Apr. 17, 2008, and English language translation thereof.

* cited by examiner

*Primary Examiner*—Charles D Garber
*Assistant Examiner*—Benjamin Tzu-Hung Liu
(74) *Attorney, Agent, or Firm*—Finnegan, Henderson, Farabow, Garrett & Dunner, L.L.P.

(57) ABSTRACT

There is disclosed a semiconductor device including a plurality of memory cell transistors, each memory cell transistor including a floating gate electrode isolated from each other via an isolation insulating film every memory cell transistor, an inter-electrode insulating film comprising a $Hf_xAl_{1-x}O_y$ film ($0.8 \leq x \leq 0.95$) formed on the floating gate electrode, and a control gate electrode formed on the inter-electrode insulating film, wherein the memory cell transistors are arrayed to form a memory cell array.

12 Claims, 25 Drawing Sheets

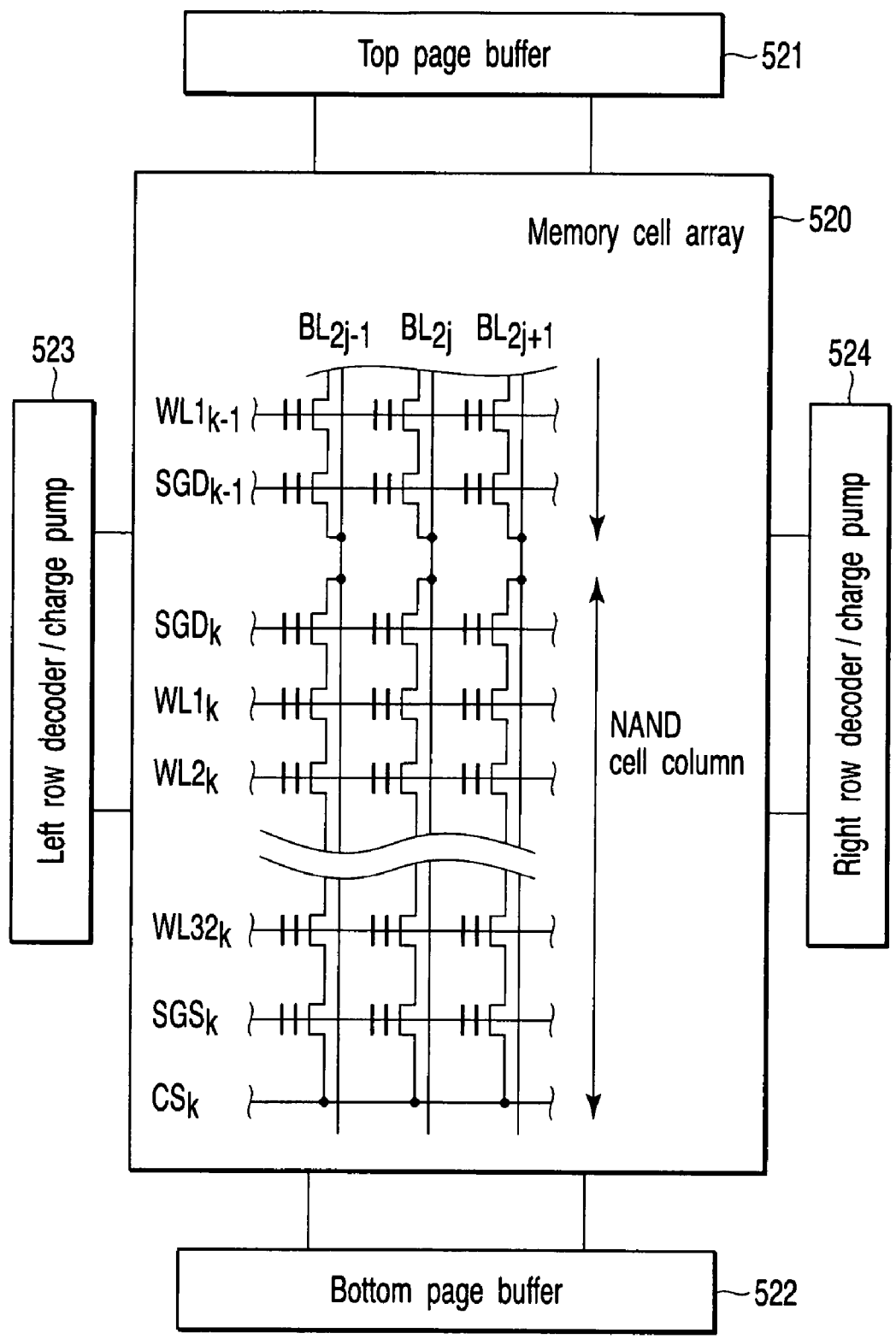
F I G. 1

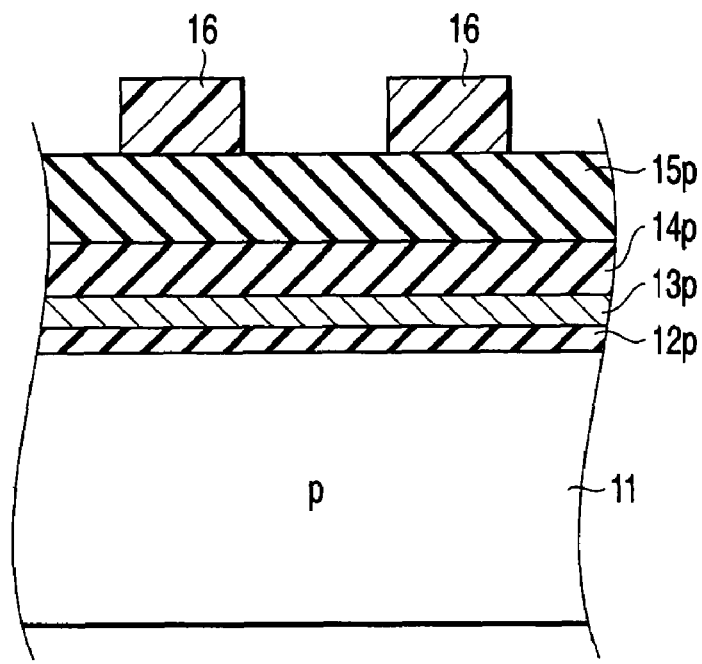
F I G. 13
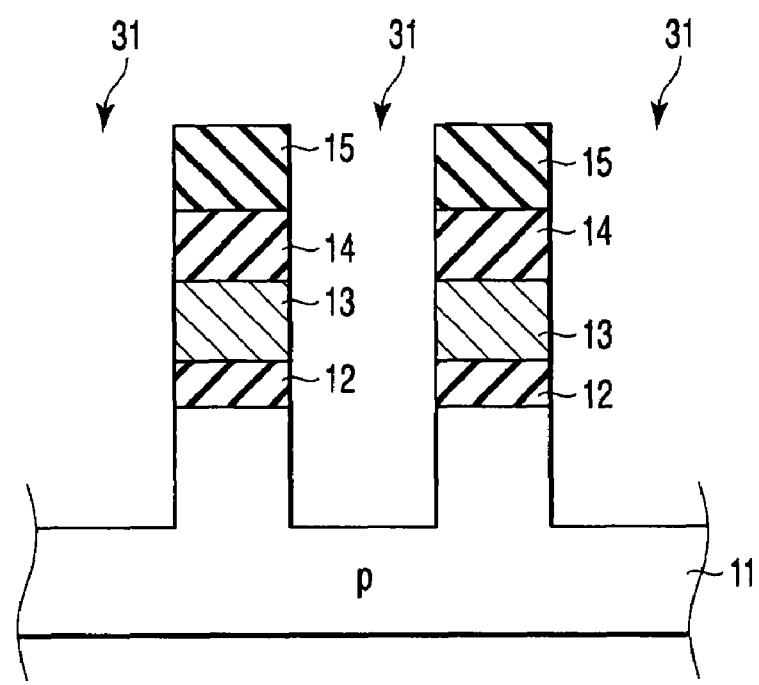
F I G. 14

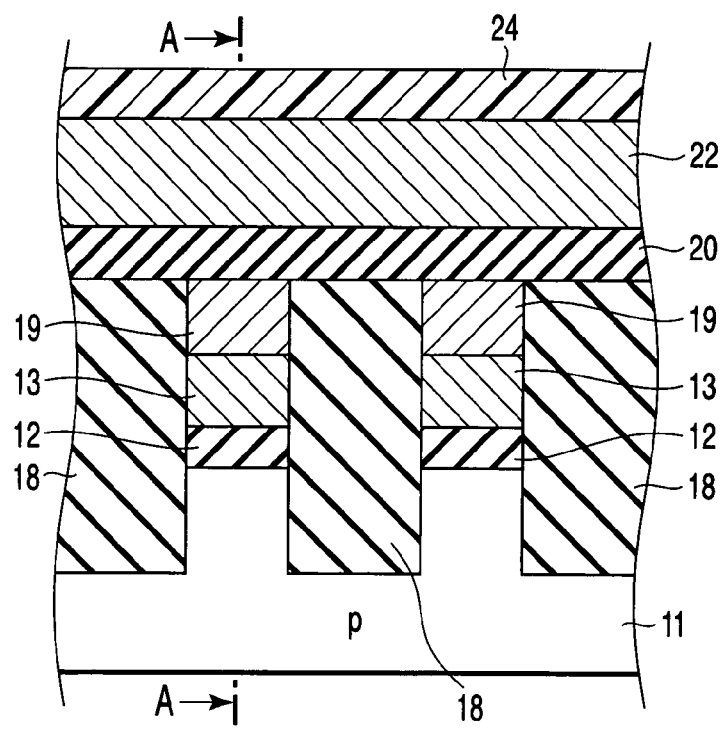
F I G. 21
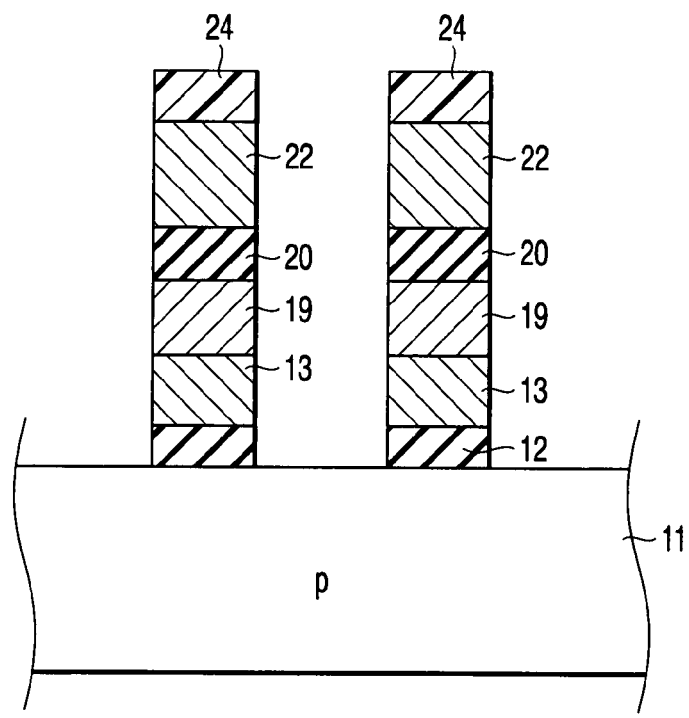
F I G. 22

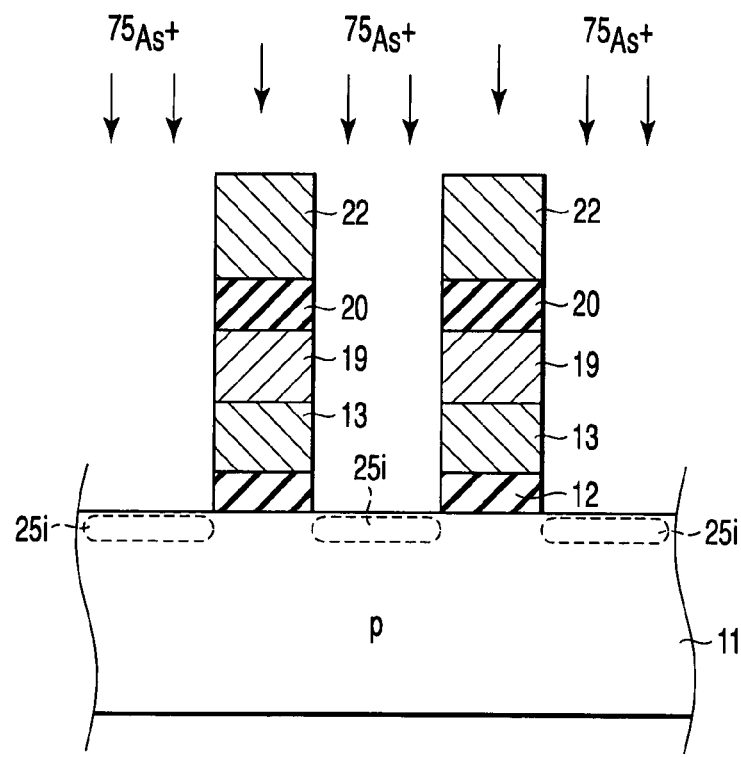
F I G. 2 3
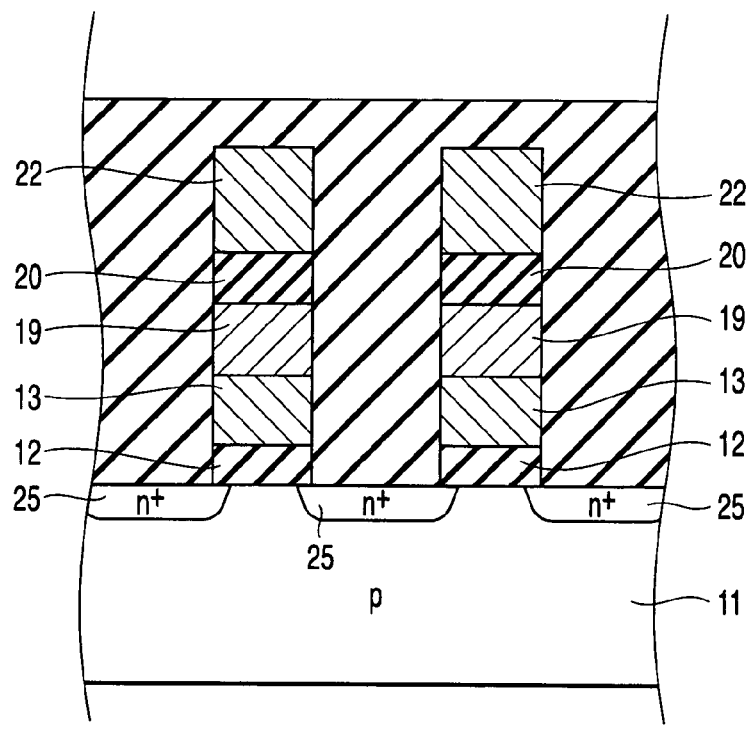
F I G. 2 4

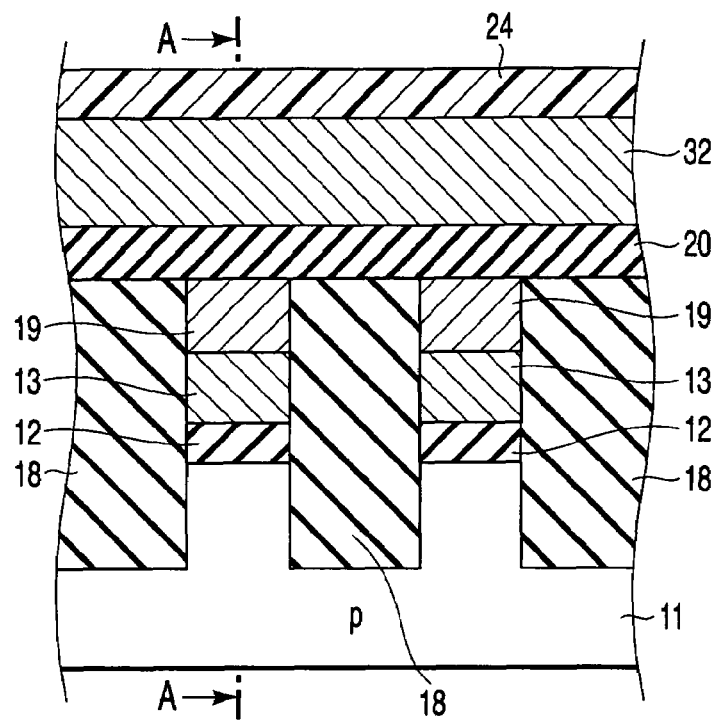
F I G. 27
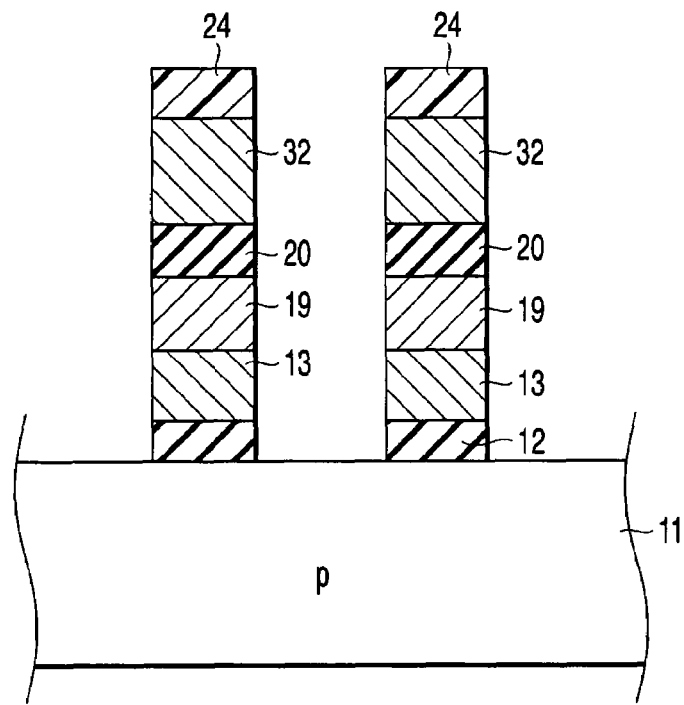
F I G. 28

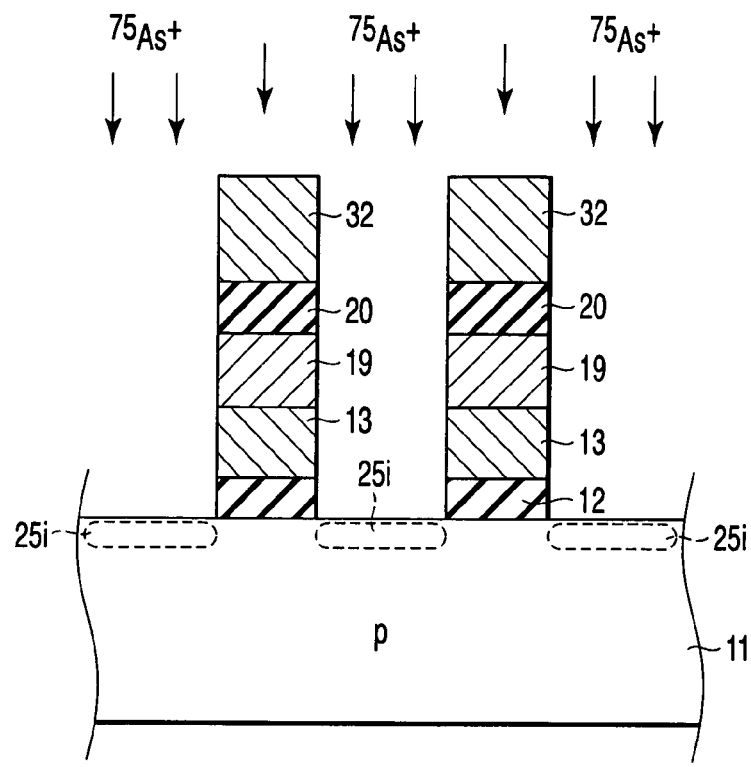
F I G. 29
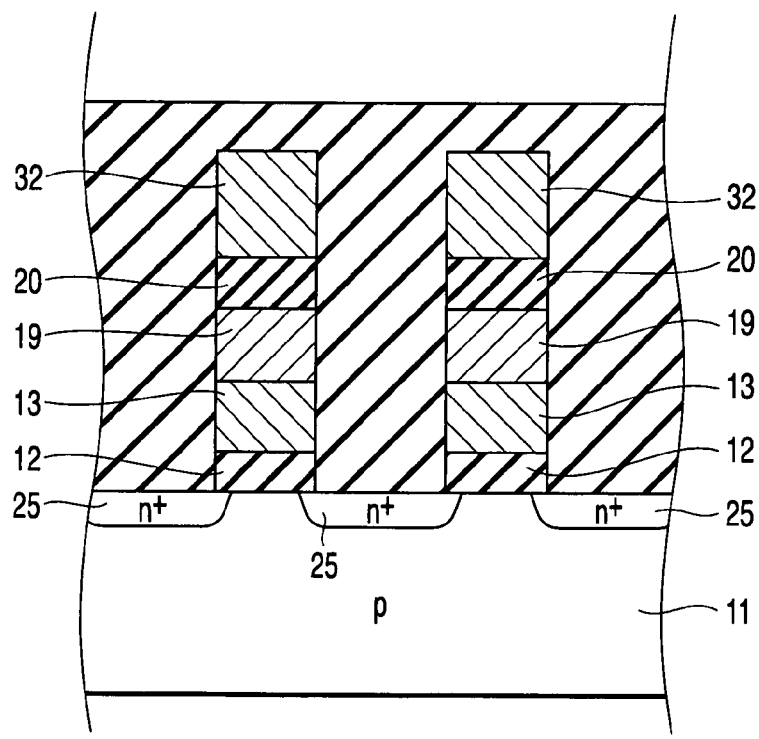
F I G. 30

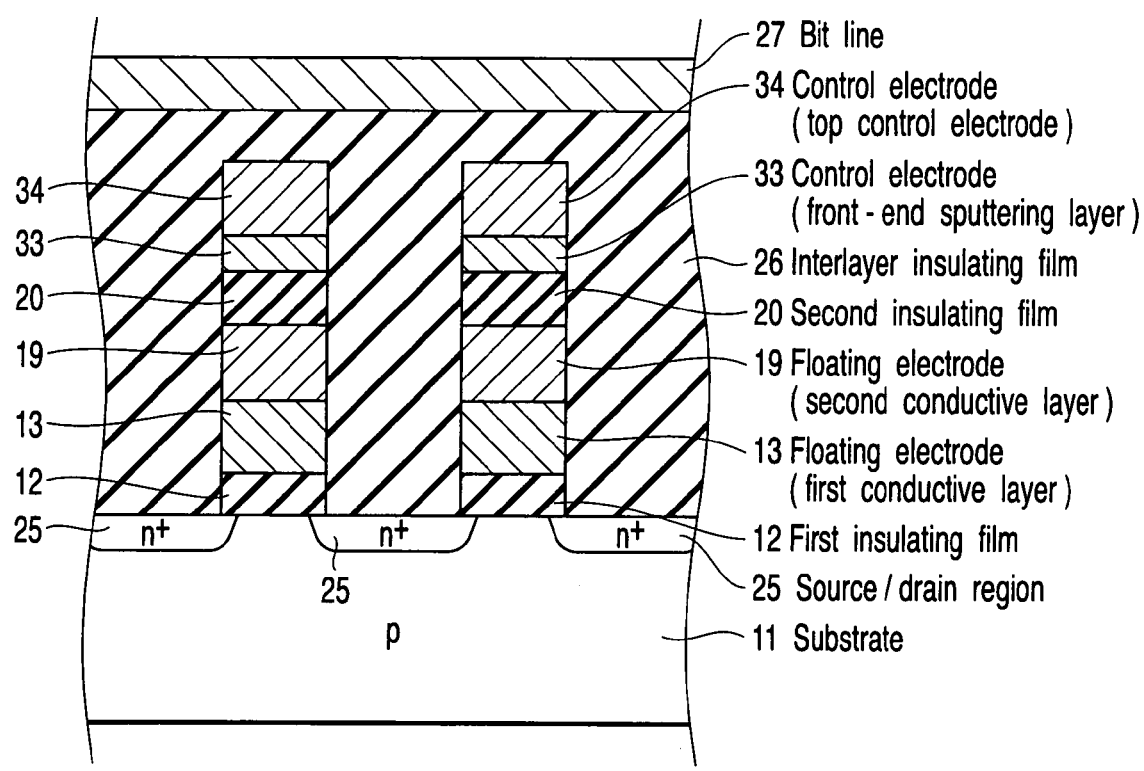
F I G. 3 1

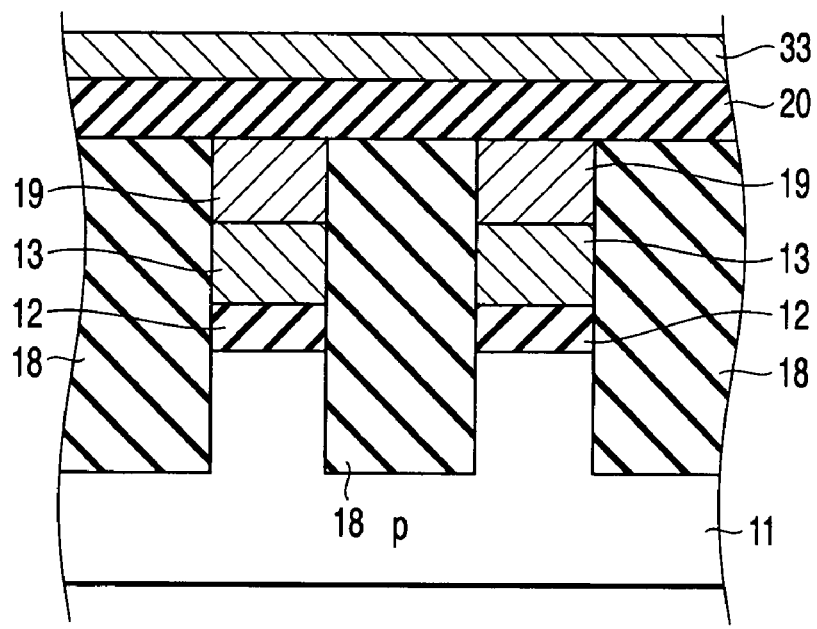
F I G. 3 2
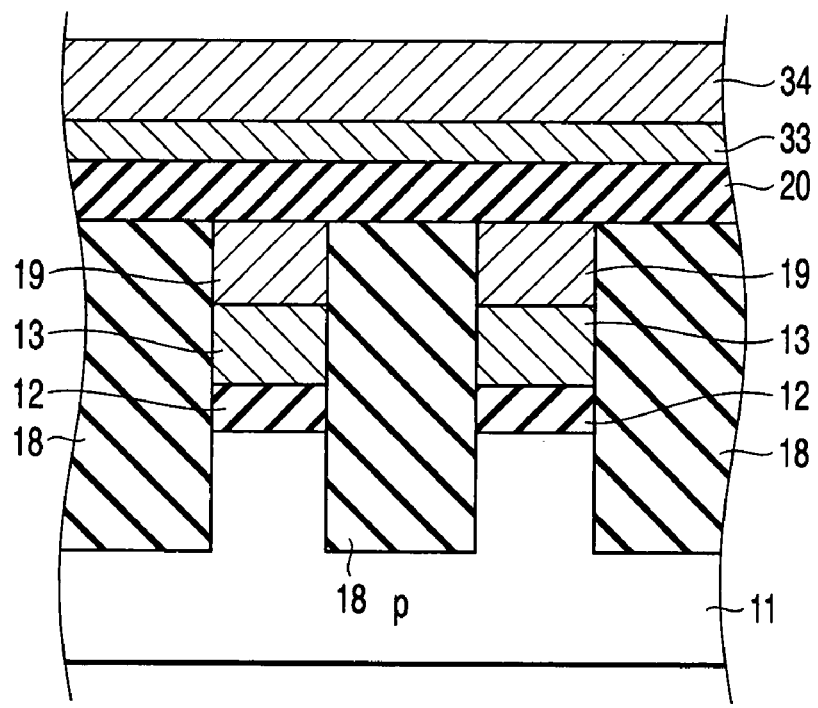
F I G. 3 3

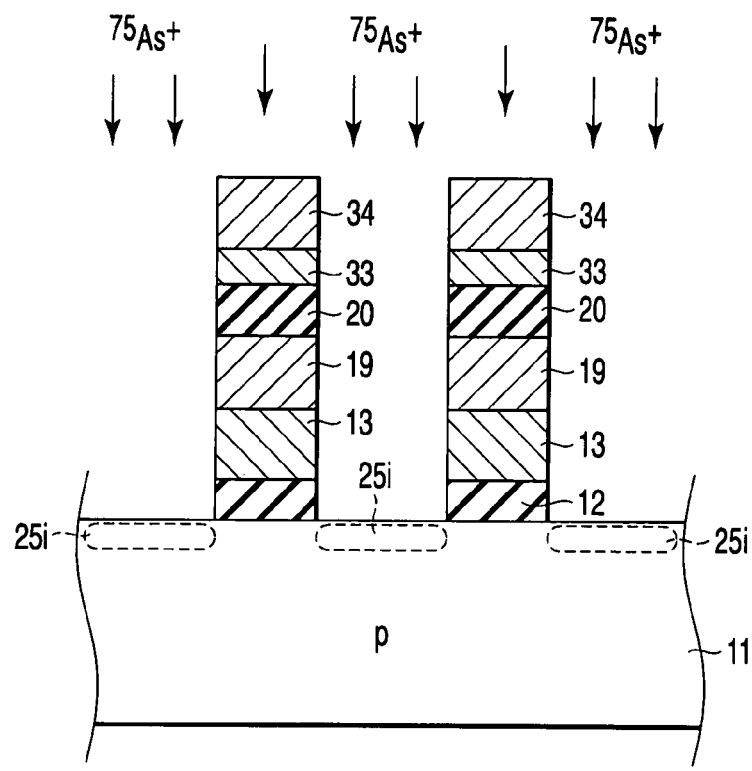
F I G. 36
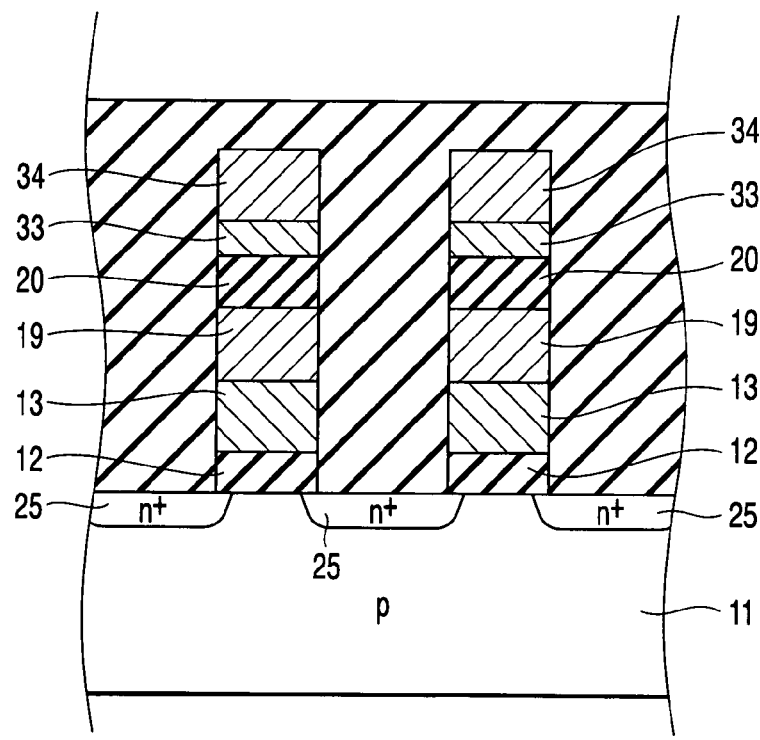
F I G. 37

SEMICONDUCTOR DEVICE AND METHOD OF MANUFACTURING THE SAME

CROSS-REFERENCE TO RELATED APPLICATIONS

This application is based upon and claims the benefit of priority from prior Japanese Patent Application No. 2006-186040, filed Jul. 5, 2006, the entire contents of which are incorporated herein by reference.

BACKGROUND OF THE INVENTION

1. Field of the Invention

The present invention relates to various semiconductor devices that use a capacitor or gate insulating film as a high relative dielectric constant insulating film, and a method of manufacturing the same.

2. Description of the Related Art

Recently, a capacitor insulating film and a gate insulating film are thinned more and more with high density of a LSI. In order to prevent a leak current from increasing with the foregoing thinning, a three-dimensional structure is changed, and thereby, the way to solve the problem is found. On the other hand, a high relative dielectric constant insulating film is used, and thereby, a physical film thickness is increased to prevent an increase of the leak current.

In particular, an inter-poly dielectric film (inter-electrode insulating film) is formed between a charge storage layer and a control gate electrode in a non-volatile semiconductor memory device such as flash memory. For example, an ONO film (three-layer stacked film, that is, silicon oxide film/silicon nitride film/silicon oxide film) is used as the foregoing inter-poly dielectric film. By doing so, a relative dielectric constant is improved, and three-dimensional structure is employed. However, the distance between cells is reduced; for this reason, interference between neighboring cells remarkably increases, and this is a factor of worsening device characteristics. As a result, there is a problem that it is difficult to employ the three-dimensional structure to increase an area.

For example, Jpn. Pat. Appln. KOKAI Publication No. 2003-7861 discloses the following technique in order to realize a next-generation non-volatile semiconductor memory device. According to the technique, a high relative dielectric constant insulating film having a relative dielectric constant $\in_r$ larger than conventionally is used as the inter-poly dielectric film. Specifically, the relative dielectric constant $\in_r$ is larger than a relative dielectric constant $\in_r=3.8$ to 4 of the conventionally used silicon oxide film (SiO$_2$ film). The foregoing high relative dielectric constant insulating film is used, and thereby, a capacity is made large without increasing the area. Therefore, there is no need of giving the three-dimensional structure, so that the manufacturing process is simplified. As a result, an element has high performance, and the method of manufacturing the device is made easy; therefore, a manufacturing process having high yield is realized.

A composite oxide such as hafnium aluminate (Hf$_x$AL$_{1-x}$O$_y$) is used as the foregoing high relative dielectric constant insulating film. The high relative dielectric constant insulating film is formed via a CVD process such as ALD process resulting from the following reasons of uniformity, mass production and low damage.

The following problem arises if the foregoing film is used as an inter-electrode insulating film of a semiconductor memory device, in particular, non-volatile semiconductor memory device. In this case, an applied electric filed is high; for this reason, leak current is not sufficiently restricted.

In the foregoing description, a problem in the prior art is described giving the inter-electrode insulating film of the non-volatile semiconductor memory device. In this case, the problem of the leak current of the high relative dielectric constant insulating film is not limited to the non-volatile semiconductor memory device. The same problem arises in the case of using the high relative dielectric constant insulating film as a capacitor insulating film of a storage (accumulation) capacitor. Further, the same problem exists in various insulating gate transistors employing a MOS capacitor using the high relative dielectric constant insulating film as the capacitor insulating film. Furthermore, the same leak current problem by high electric field exists in the following insulating gate transistors. One is an insulating gate transistor used as super high-speed switching element for logic integrated circuits. Another is an insulating gate transistor operating in a high frequency band such as terahertz. In particular, in an insulating gate transistor having a gate length of about 60 nm or less, the field strength of the high relative dielectric constant insulating film used as a gate insulating film becomes large. As a result, the leak current by high electric filed becomes a big problem.

BRIEF SUMMARY OF THE INVENTION

According to an aspect of the invention, there is provided a semiconductor device comprising: a plurality of memory cell transistors, each memory cell transistor including: a floating gate electrode isolated from each other via an isolation insulating film every memory cell transistor; an inter-electrode insulating film comprising a Hf$_x$Al$_{1-x}$O$_y$ film ($0.8 \leq x \leq 0.95$) formed on the floating gate electrode; and a control gate electrode formed on the inter-electrode insulating film, wherein the memory cell transistors are arrayed to form a memory cell array.

According to another aspect of the invention, there is provided a semiconductor device including a memory cell array having a plurality of arrayed memory cells, each the memory cell including: a switching transistor; and a storage capacitor comprising a bottom electrode connected to a drain region of the switching transistor, a capacitor insulating film including a Hf$_x$Al$_{1-x}$O$_y$ film ($0.8 \leq x \leq 0.95$) formed on the bottom electrode, and a top electrode formed on the capacitor insulating film and connected to a plate electrode.

According to yet another aspect of the invention, there is provided a manufacturing method for a semiconductor device including a memory cell array, comprising: forming a gate insulating film on a surface of a semiconductor substrate; forming a floating gate electrode on the gate insulating film; selectively etching the floating gate electrode, the gate insulating film and part of the surface of the semiconductor substrate to form an isolation trench to isolate a plurality of memory cells; filling an isolation insulating film electrically isolating the memory cell in the isolation trench; forming an inter-electrode insulating film comprising a Hf$_x$Al$_{1-x}$O$_y$ film by alternately introducing a hafnium (hf) material gas and a oxidizing agent and by alternately introducing an aluminum (al) material gas and a oxidizing agent on an upper portion of the floating gate electrode; forming a control gate electrode on the inter-electrode insulating film; and setting a ratio of the number of times of alternately introducing a hafnium (hf) material gas and a oxidizing agent to the total number of times of alternately introducing a hafnium (hf) material gas and a oxidizing agent and alternately introducing an aluminum (al) material gas and a oxidizing agent to 0.8 or more and 0.95 or less.

According to still another aspect of the invention, there is provided a manufacturing method for a semiconductor device including a memory cell array, comprising: forming a gate insulating film on a surface of a semiconductor substrate; forming a floating gate electrode on the gate insulating film; selectively etching the floating gate electrode, the gate insulating film and part of the surface of the semiconductor substrate to form an isolation trench to isolate a plurality of memory cells; filling an isolation insulating film electrically isolating between the memory cells in the isolation trench; forming an inter-electrode insulating film comprising a high relative dielectric constant insulating film on an upper portion of the floating gate electrode; forming a control gate electrode on the inter-electrode insulating film; and forming a conductive layer given as a part of the control gate electrode contacting with at least inter-electrode insulating film using a sputtering process.

BRIEF DESCRIPTION OF THE SEVERAL VIEWS OF THE DRAWING

FIG. 1 is a block diagram showing the configuration of a logic circuit of a semiconductor device (non-volatile semiconductor memory device: NAND type flash memory) according to a first embodiment of the present invention;

FIG. 13 is a process sectional view to explain a method of manufacturing a semiconductor device (non-volatile semiconductor memory device) according to a first embodiment of the present invention;

FIG. 14 is a process sectional view to explain the method of manufacturing the semiconductor device according to the first embodiment of the present invention;

FIG. 21 is a process sectional view to explain the method of manufacturing the semiconductor device according to the first embodiment of the present invention;

FIG. 22 is a process sectional view to explain the method of manufacturing the semiconductor device according to the first embodiment of the present invention;

FIG. 23 is a process sectional view to explain the method of manufacturing the semiconductor device according to the first embodiment of the present invention;

FIG. 24 is a process sectional view to explain the method of manufacturing the semiconductor device according to the first embodiment of the present invention;

FIG. 27 is a process sectional view to explain the method of manufacturing the semiconductor device according to the second embodiment of the present invention;

FIG. 28 is a process sectional view to explain the method of manufacturing the semiconductor device according to the second embodiment of the present invention;

FIG. 29 is a process sectional view to explain the method of manufacturing the semiconductor device according to the second embodiment of the present invention;

FIG. 30 is a process sectional view to explain the method of manufacturing the semiconductor device according to the second embodiment of the present invention;

FIG. 31 is a cross-sectional view cut along a bit line direction (A-A direction) of FIG. 2, and showing part (NAND cell column) of a memory cell array of a semiconductor device (non-volatile semiconductor memory device) according to a third embodiment of the present invention;

FIG. 32 is a process sectional view to explain a method of manufacturing the semiconductor device (non-volatile semiconductor memory device) according to the third embodiment of the present invention;

FIG. 33 is a process sectional view to explain a method of manufacturing the semiconductor device according to the third embodiment of the present invention;

FIG. 36 is a process sectional view to explain the method of manufacturing the semiconductor device according to the third embodiment of the present invention;

FIG. 37 is a process sectional view to explain the method of manufacturing the semiconductor device according to the third embodiment of the present invention;

DETAILED DESCRIPTION OF THE INVENTION

Figure 2:
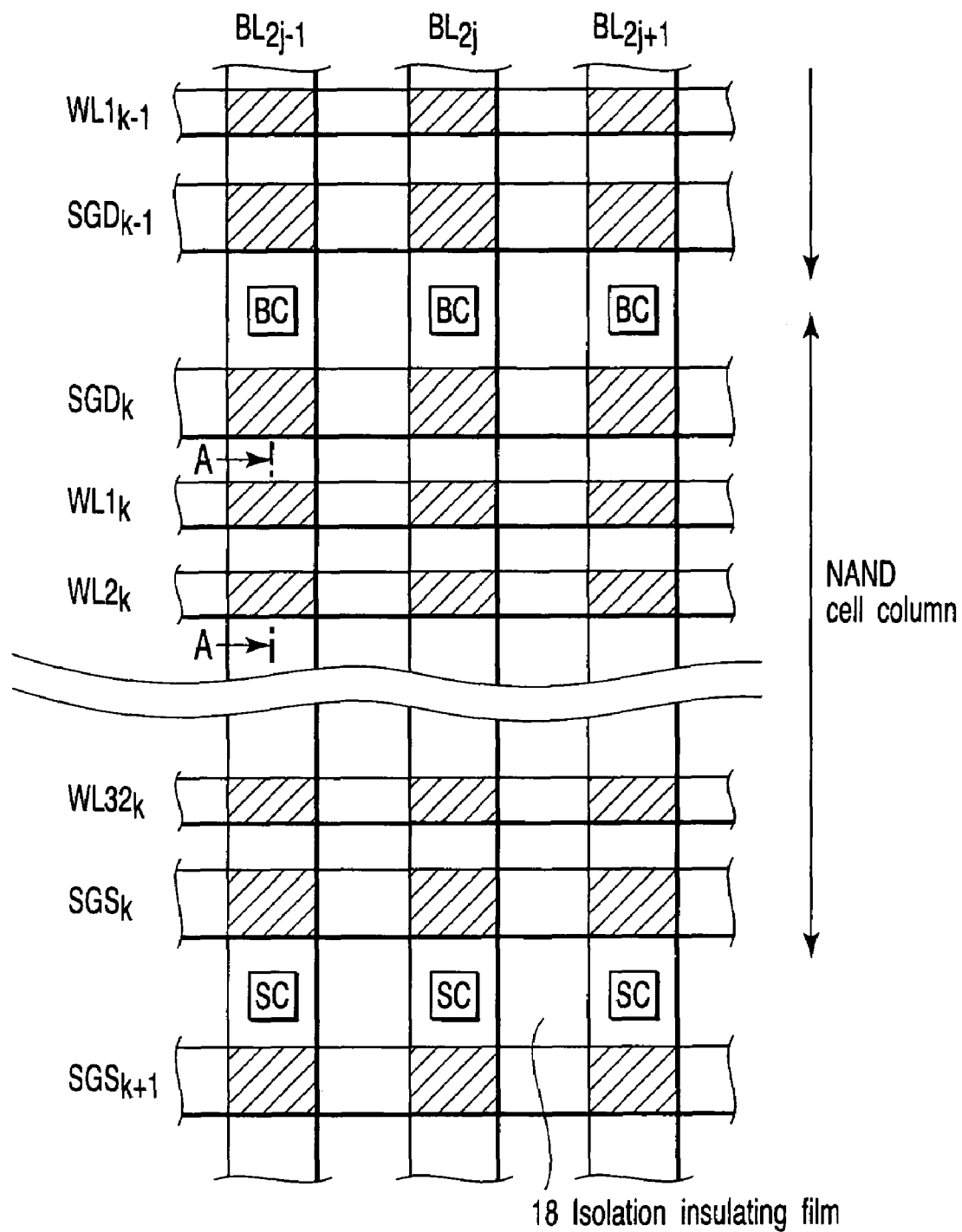
FIG. 2 is a top plan view schematically showing the configuration of a physical layout pattern of part of a memory cell array of the semiconductor memory device shown in FIG. 1.

First to fourth embodiments of the present invention will be hereinafter described with reference to the accompanying drawings. In the following drawings, the same or similar reference numerals are used to designate the same or similar portion. Incidentally, the drawings are schematically shown, and please note that the relationship between a thickness and a plane dimension and a ratio of thickness of each layer are different from a real magnitude. Therefore, detailed thickness and dimension should be determined considering the following description. Of course, in the drawings, the dimensional relationship and the ratio are different. The following first to fourth embodiments are given to embody a device and a method for realizing the technical concept of the invention. According to the technical concept of the invention, material quality of components, shape, structure, arrangement are not limited to the following description. The technical concept of the invention may be variously changed within the following scope.

According to the following first to fourth embodiments, a so-called high relative dielectric constant insulating film (high-k film) is used as an Inter-Poly Dielectrics: IPD of a non-volatile semiconductor memory device. The present invention is not limited to the non-volatile semiconductor memory device. In this case, the present invention is applicable to semiconductor devices such as DRAM and SRAM. For example, the following structure is employed so long as a high dielectric memory is equivalent to a 1-cell 1-transistor DRAM. Specifically, the inter-poly dielectric film (inter-electrode insulating film) of the non-volatile semiconductor memory device described in the first to fourth embodiments is used as a capacitor insulating film of a storage capacitor of the high dielectric memory. A floating gate electrode (FG) is used as a storage electrode (bottom electrode) connected to a switching transistor of the high dielectric memory. A control gate electrode (CG) of the non-volatile semiconductor memory device is used as a top electrode connected to a plate electrode of the high dielectric memory. In addition, the present invention applicable to various insulating gate type transistors using the high relative dielectric constant insulating film as a gate insulating film. Therefore, the present invention is applicable to various semiconductor devices such as super high speed switching element for logic integrated circuits and independent device (discrete device) operating at high frequency band such as terahertz.

First Embodiment

FIG. 1 is a block diagram schematically showing the circuit configuration of a NAND type non-volatile semiconductor memory device (flash memory) given as one example of a semiconductor device according to a first embodiment of the present invention. A memory cell array 520 is provided with peripheral circuits (21, 22, 23, 24) at its peripheral portions. Specifically, a top page buffer 521, a bottom page buffer 522, a left row decoder/charge pump 523 and a right row decoder/charge pump 524 are arrayed.

As shown in FIG. 2, the memory cell array 520 includes a plurality of word lines $WL1_k$, $WL2_k$, ... $WL32_k$, $WL1_{k-1}$ arrayed along the row direction. The memory cell array 520 further includes a plurality of bit lines $BL_{2j-1}$, $BL_{2j}$, $BL_{2j+1}$, arrayed in the column direction perpendicular to the word lines $WL1_k$, $WL2_k$, ..., $WL32_k$, $WL1_{k-1}$. Memory cell transistors having a charge storage layer are arrayed along the column direction of FIG. 2. Each charge storage state of the memory cell transistors is controlled via any of the word lines $WL1_k$, $WL2_k$, ... $WL32_k$, $WL1_{k-1}$ .... As seen from the plan view of FIG. 8, an isolation insulating film 18 is formed in parallel along the column direction. Neighboring memory cell transistors are isolated via the isolation insulating film 18.

FIG. 1 and FIG. 2 show the case where the memory cell column is configured in such a manner that 32 memory cell transistors are arrayed in the column direction. Both ends of the memory cell column array are provided with a pair of select transistors, which are arrayed adjacent to the column direction. The select transistors select a group of memory cell transistors arrayed along the memory cell column. Each gate of the paired select transistors is connected with a pair of select gate interconnects $SGD_k$ and $SGS_k$.

In FIG. 2, a bit line contact BC is arrayed at the top end of each memory cell column perpendicular to the word lines $WL1_k$, $WL2_k$, ... $WL32_k$. The bottom end of each memory cell column is provided with a source line contact SC. Although no illustrated in FIG. 2, a source line $CS_k$ is connected extending in parallel with the word lines $WL1_k$, $WL2_k$, ... $WL32_k$, as illustrated in FIG. 1. As seen from FIG. 1, the bit line contact BC of each memory cell column is connected with bit lines $BL_{2j-1}$, $BL_{2j}$, $BL_{2j+1}$, ....

The foregoing top and bottom page buffers 521 and 522 illustrated in FIG. 1 are connected to the bit lines $BL_{2j-1}$, $BL_{2j}$, $BL_{2j+1}$, .... These buffers are used for reading each memory cell column information. The foregoing left and right row decoder/charge pumps 523 and 524 are connected to the word lines $WL1_k$, $WL2_k$, $WL32_k$, $WL1_{k-1}$ .... These left and right row decoder/charge pumps 523 and 524 control a charge storage state of each of memory cell transistors forming the memory cell column.

Figure 3:
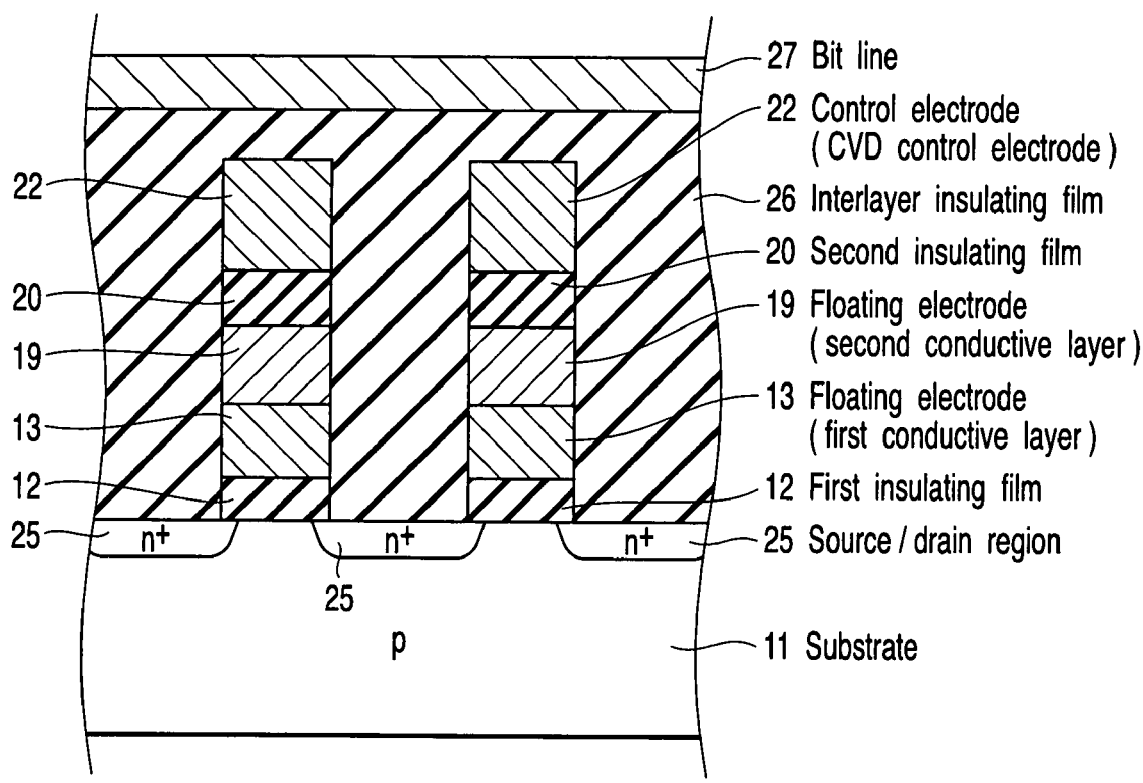
FIG. 3 is a cross-sectional view showing part (NAND cell column) of the memory cell array cut along a bit line (A-A direction) of FIG. 2.

FIG. 3 is a cross-sectional view schematically showing part of the memory cell array 520 when viewing it from the A-A direction (row direction) of FIG. 2. In other words, FIG. 3 is equivalent to a cross section along the direction of the bit lines $BL_{2j-1}$, $BL_{2j}$, $BL_{2j+1}$, . . . illustrated in FIG. 1. As depicted in the cross-section view of FIG. 3, a surface of a p-type semiconductor substrate 11 is formed with a source/drain region 25 of the memory cell transistor. A gate insulating film (first insulating film) 12 is formed on a channel region defined between the source/drain regions 25. The source/drain region 25 is an $n^+$ type semiconductor region doping an n type impurity into the p-type semiconductor substrate 11 at high concentration. Although no illustration in FIG. 3, a select transistor having the same structure as the memory cell transistor is positioned at the end of the memory cell column as is evident from FIG. 1 and FIG. 2. The source/drain region functions as a bit line contact region. A p type well region (p well) formed in an n type semiconductor substrate may be used in place of the p-type semiconductor substrate 11.

Floating gate electrodes (13, 19) for storing a charge are formed on the gate insulating film (first insulating film) 12. An inter-electrode insulating film (second insulating film) 20 is formed on the floating gate electrodes (13, 19). A control gate electrode (CVD control gate electrode) 22 is formed on the inter-electrode insulating film (second insulating film) 20. The foregoing components form a gate electrode of each memory cell transistor. Although no illustration, the select transistor has a gate electrode structure comprising the foregoing gate insulating film (first insulating film) 12, floating gate electrodes (13, 19), inter-electrode insulating film (second insulating film) 20, and control gate electrode (CVD control gate electrode) 22. In this case, the control gate electrode 22 is electrically conductive with the floating gate electrodes (13, 19) via an opening (hole) formed in the inter-electrode insulating film (second insulating film). The control gate electrode (CVD control gate electrode) 22 is electrically conductive with the floating gate electrodes (13, 19) via an inter-electrode insulating film short-circuit window of the inter-electrode insulating film (second insulating film) 20. As seen from FIG. 2, the floating gate electrodes (13, 19) of the memory cell transistor belong to each neighboring memory cell column face each other in the row direction (word line direction) via the isolating insulating film forming STI.

The floating gate electrode (13, 19) functioning as a charge storage layer has the following two-layer structure. One is a first polysilicon (hereinafter, referred to as "doped polysilicon") film (first conductive layer) 13 doped with n type impurities such as phosphorus (P) and arsenic (As). Another is a second polysilicon film (second conductive layer) 19 doped with a n type impurity. The impurity density of the second polysilicon film (second conductive layer) 19 may be set high than that of the first polysilicon film (first conductive layer) 13.

The control gate electrode (CVD control gate electrode) 22 has the following three-layer structure comprising a polysilicon film doped with an n type impurity, a tungsten silicide film ($WSi_2$ film) and a cap insulating film. The following metal silicide films are usable as the silicide film in addition to the tungsten silicide film $WSi_2$ film). The metal silicide films include a cobalt silicide film ($CoSi_2$ film), titanium silicide film ($TiSi_2$ film) and molybdenum ($MoSi_2$ film). High melting point metal films such as tungsten film (W film), cobalt film (Co film), titanium film (Ti film) and molybdenum film (Mo film) are usable in place of the silicide film. In addition, a poly-silicide film using these silicide films is usable. Moreover, in place of the silicide film, a high-conduction metal film such as aluminum (Al) or copper (Cu) is formed on the polysilicon film. The high-conduction metal film may use as the word lines $WL1_k$, $WL2_k$, . . . $WL32_k$, $WL1_{k-1}$ . . . . Any one of tungsten nitride film (WN film) and titanium nitride film (TiN film, $Ti_2N$ film) or a layer stacking those may be formed on the polysilicon film in place of the silicide film.

Although no illustration in FIG. 3, a peripheral transistor comprises a transistor having a gate electrode having the following structure. Specifically, the gate electrode has the same stacked structure as the select transistor or the structure having the control gate electrode (CVD control gate electrode) 22 only. In this case, the floating gate electrode (13, 19) and the inter-electrode insulating film (second insulating film) 20 are removed from the stacked structure of the select transistor.

As is evident from the cross-sectional view along the bit line direction shown in FIG. 3, the floating gate electrodes (13, 19) of each memory cell transistor face each other via the interlayer insulating film 26 in the semiconductor device according to the first embodiment. In this case, the interlayer insulating film 26 having a relative dielectric constant $\in_r$ lower than 3.9 is filled between floating gate electrodes (13, 19) of a plurality of memory cell transistors arrayed in the column direction. By doing so, it is possible to prevent write error resulting from a column direction proximity cell interference effect occurring between memory cell transistors.

In FIG. 3, although a detailed structure is not illustrated, for example, a cell isolation front-end film formed of a silicon oxide film having a thickness of about 6 nm may be formed at a sidewall of the stacked structure (13, 19, 20, 22) comprising the following films. That is, 13 is the first polysilicon film (first conductive layer), 19 is the second polysilicon film (second conductive layer), 20 is the inter-electrode insulating film (second insulating film), and 22 is the control gate electrode (CVD control gate electrode. A two-layer structure comprising the interlayer insulating film 26 and a core filling insulating film may be used between cell column select transistors adjacent to the row direction. For example, a BPSG film is usable as the core filling insulating film. Specifically, the core filling insulating film is formed to fill it in the center of a recess formed by the interlayer insulating film 26. A contact plug is buried through the center portion of the core filling insulating film. The contact plug has a low contact resistance, and has ohmic-contact with a bit line contact region (not shown). The contact plug is connected to the bit line ($BL_{2j}$) 27 formed on the interlayer insulating film 26. In FIG. 3, the bit line 27 is formed on the interlayer insulating film 26. In this case, the interlayer insulating film 26 is formed with a damascene trench, and then, a metal interconnect consisting of copper (Cu) as a main component is filled in the damascene trench to form a damascene interconnection.

In this case, a silicon oxide film ($SiO_2$ film) as "a high relative dielectric constant insulating film" having a large relative dielectric constant is used as the inter-electrode insulating film (second insulating film) 20. Preferably, the relative dielectric constant of the silicon oxide film ($SiO_2$ film) is larger than about 3.8 to 4. In particular, a film having a relative dielectric constant of about 5 to 5.5 obtained from the conventional ONO film. A hafnium aluminate film ($Hf_xAl_{1-x}O_y$ film) is expected as one example of the foregoing "high relative dielectric constant insulating film". The hafnium aluminate film is a mixed crystal of a hafnium oxide film ($HfO_2$ film) having a relative dielectric constant $\in_r$=about 22 to 30 and an aluminum oxide film ($Al_2O_3$ film) having a relative dielectric constant $\in_r$=about 6 to 13. The foregoing $Hf_xAl_{1-x}O_y$ film is a ternary compound, and the composition x of hafnium (Hf) is controlled, and thereby, theoretically, there is a possible that the relative dielectric constant $\in_r$ is controlled to a range from about 6 to 30. However, the composition x of hafnium (Hf) becomes large, it is reported that there is a tendency to increase a leak current in the conventional case. Thus, the optimum composition x of hafnium (Hf) usable as the inter-electrode insulating film (second insulating film) 20 has not yet been known.

Considering the foregoing problem, in this embodiment, an experimental study is made about the optimum composition x of hafnium (Hf) of the $Hf_xAl_{1-x}O_y$ film applicable to semiconductor devices. A growth method for obtaining the optimum composition x of hafnium (Hf) will be described below. Specifically, the $Hf_xAl_{1-x}O_y$ film is grown using the following atomic layer deposition (ALD) or molecular layer deposition (MLD). The composition x is controlled using a ratio of stacked layer times in a gas introduction sequence. By doing so, it is possible to realize the inter-electrode insulating film (second insulating film) 20 having the optimum composition x of hafnium (Hf). The high-quality $Hf_xAl_{1-x}O_y$ film having the optimum controlled composition x is formed using the following process.

First, the silicon substrate 11 is placed in a vacuum chamber, and thereafter, the vacuum chamber is vacuumed and exhausted up to a desired ultimate pressure, for example, about 1 Pa to $10^{-8}$ Pa using a dry pump, turbo molecular pump and cryopump. (In this case, an oxide film is grown; therefore, the ultimate pressure may be about 1 Pa.) The pressure reaches the foregoing ultimate pressure, and thereafter, the silicon substrate 11 is heated to about 200° C. to 400° C., preferably about 250° C. to 350° C., for example, about 290° C. Then, aluminum (Al) material gas, hafnium (Hf) material gas and oxidizing agent are alternately introduced into t vacuum chamber according the timing chart shown in FIG. 4. In the alternate gas introduction, the vacuum chamber is controlled using the dry pump so that a film forming pressure becomes about 20 Pa to 60 Pa, preferably, about 30 Pa to 50 Pa, for example, about 40 Pa. Thus, the internal pressure of the vacuum chamber is kept at the film forming pressure. In the timing chart shown in FIG. 4, tri-methyl aluminum $((CH_3)_3Al: TMA)$ is used as the Al material gas. Ozone $(O_3)$ is used as the oxidizing agent, and tetrakis (ethyl-methyl amino) hafnium $(Hf[N(C_2H_5)CH_3]: TEMAH)$ is used.

Figure 4:
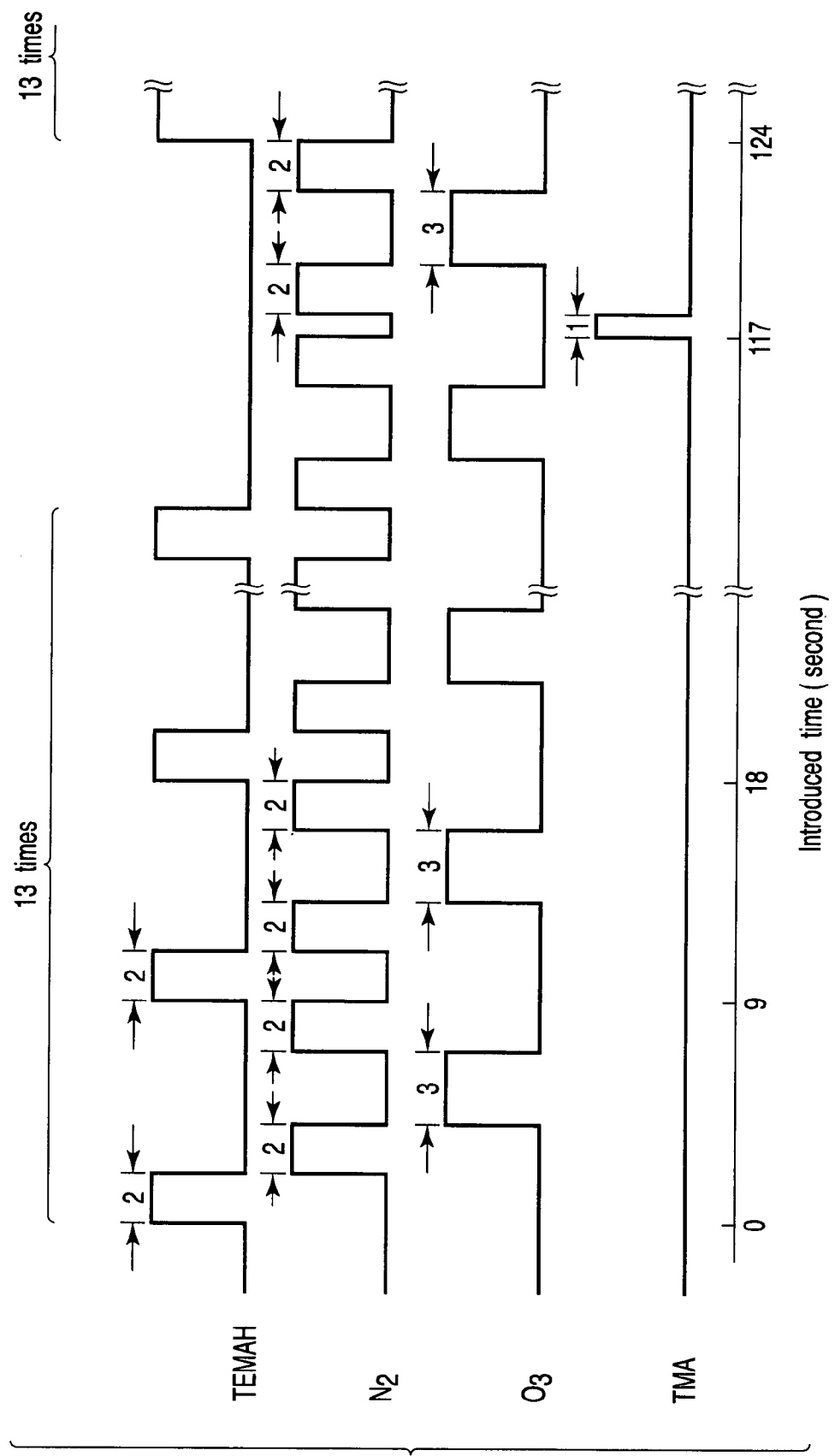
FIG. 4 is a timing chart showing a gas introduction sequence to grow a $Hf_xAl_{1-x}O_y$ film by alternately introducing a material gas in a method of manufacturing a semiconductor device according to a first embodiment of the present invention.

According to the timing chart shown in FIG. 4, gas supply time is as follows. Namely, TMA, TEMAH and $O_3$ are about 1 second, about two seconds and about three seconds, respectively. In addition, nitrogen $(N_2)$ for purge is introduced at about 8.5 Pa·m³/s (5 slm) for about 2 to 3 seconds between the supply of TMA and $O_3$ and between the supply of TEMAH and $O_3$, as seen from FIG. 4. In FIG. 4, a carrier gas flow rate is as follows; namely, TMA and TEMAH are about $3.4\times10^{-1}$ Pa·m³/s (200 sccm) and about $8.5\times10^{-1}$ P·m³/s (500 sccm). The flow rate of $O_3$ is about 8.5 Pa·m³/c (5 slm), and the concentration thereof is about 250 g/m³.

As depicted in FIG. 4, TEMAH and $O_3$ are alternately introduced via the introduction (purge) of $N_2$. By doing so, a hafnium oxide film (HfO film) is stacked like a layer. TMA and $O_3$ are alternately introduced via the introduction (purge) of $N_2$. By doing so, an aluminum oxide film (AlO film) is stacked like a layer. A ratio of the number of alternate supply times of TEMAH and $O_3$ and of the number of alternate supply times of TMA and $O_3$ is controlled. By doing so, the composition x of a hafnium aluminate film ($Hf_xAl_{1-x}O_y$ film) is controllable. Moreover, the foregoing sequence is repeated, and thereby, the $Hf_xAl_{1-x}O_y$ film having a desired thickness is obtained. In FIG. 4, one-time alternate supply of TMA and $O_3$ is given every when the alternate supply of TEMAH and $O_3$ is repeated 13 times. Further, the foregoing sequence is repeated about 18 times, and thereby, an $Hf_xAl_{1-x}O_y$ film having a thickness of about 25 nm is formed.

According to the first embodiment of the invention, the method of forming the $Hf_xAl_{1-x}O_y$ film satisfies the following condition, and thereby, it is confirmed that preferable characteristic is obtained. Specifically, the ratio of the alternate supply of TEMAH and $O_3$ to the alternate supply of TMA and $O_3$ is not limited to 13:1. The ratio ranges from about 4:1 or more to 100:1, in particular, about 9:1 or more to 19:1.

Figure 5:
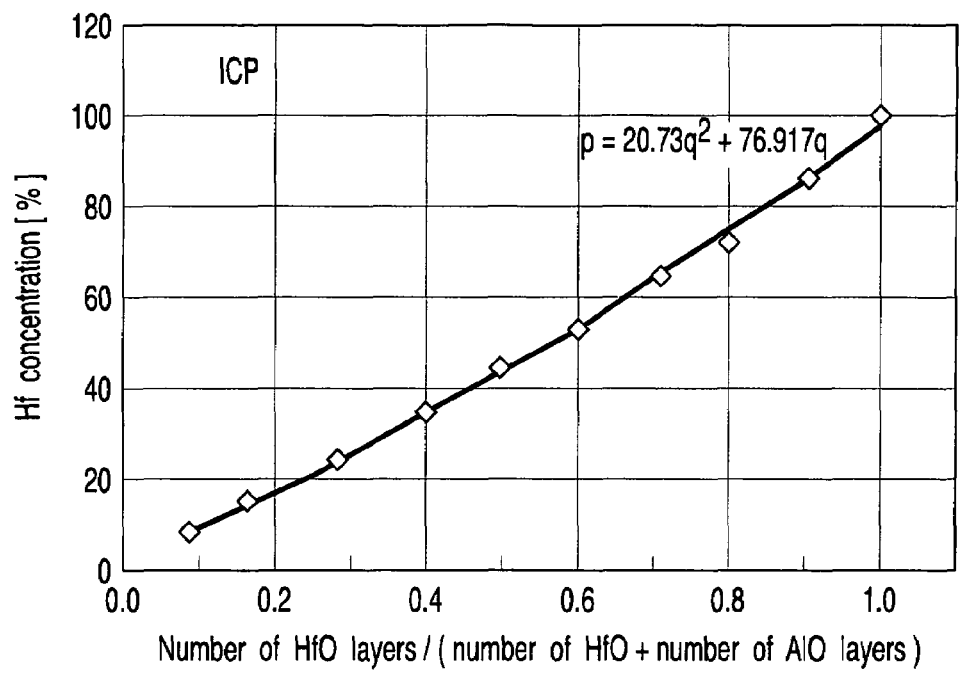
FIG. 5 is a graph showing the relationship between a ratio of the number of HfO stacked times (number of layers) to the total number of stacked times (number of layers) and Hf concentration p (mole %) of the $Hf_xAl_{1-x}O_y$ film measured using an induction combined plasma (ICP) emission analyzer.

FIG. 5 is a graph showing the relationship between a ratio q of stacked layer times in the gas introduction sequence and an Hf concentration p of the $Hf_xAl_{1-x}O_y$ film. Specifically, the ratio is a ratio q of the number of HfO stacked layer times (layer number) to the total number of stacked layer times (layer number) totalizing the number of HfO stacked layer times (layer number) and the number of AlO stacked layer times (layer number)=Hfo layer number/(hfO layer number+AlO layer number). The Hf concentration p of the $Hf_xAl_{1-x}O_y$ film is measured using an inductivity-coupled plasma (ICP) emission analyzer (=Hf mole number/Hf mole number+Al mole number). In FIG. 5, the Hf concentration p (mole %) is obtained using the following equation (1).

$$p = 20.73q^2 + 76.917q \quad (1)$$

In this case, the Hf concentration p is approximated using a quadratic curve of the ratio q of the number of layers. FIG. 5 shows a linear proportional relationship. Specifically, the Hf concentration p (mole %) measured using the ICP emission analyzer and the ratio q of the number of layers (ratio of the number of stacked layer times) q has an almost linear proportional relationship. Thus, the composition x of the $Hf_xAl_{1-x}O_y$ film is approximately equal to the ratio q of the number of stacked layer times in the gas introduction sequence.

Figure 6:
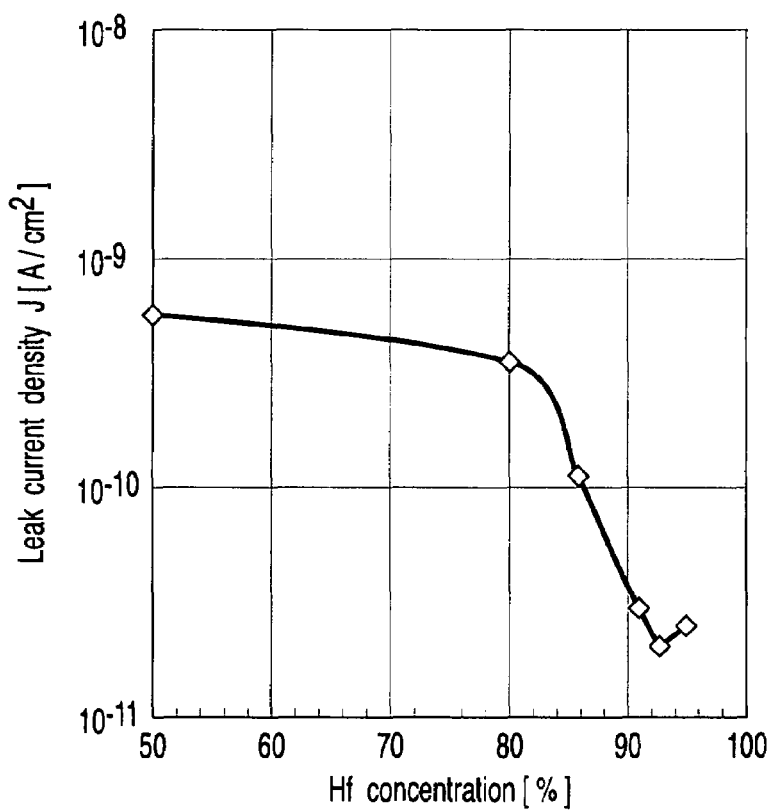
FIG. 6 is a graph showing a dependency of leak current density with respect to Hf concentration (mole %) in the $Hf_xAl_{1-x}O_y$ film.

FIG. 6 is a graph showing the relationship between the Hf concentration (mole %) determined from FIG. 5 and a leak current density of the $Hf_xAl_{1-x}O_y$ film. The leak current is obtained in the following manner. Namely, a MOS capacitor using an $Hf_xAl_{1-x}O_y$ film having an area of about 0.1 mm² as a capacitor insulating film is prepared, and then, the I-V characteristic of the MOS capacitor is measured. As seen from FIG. 6, the Hf concentration p of the $Hf_xAl_{1-x}O_y$ film (=100x: x is the composition of $Hf_xAl_{1-x}O_y$ film is set to about 75 mole % or more, in particular, a range from about 86 mole % to 92 mole % or less. By doing so, it can be seen that the leak current is sufficiently reduced. In other words, the Hf concentration p of the $Hf_xAl_{1-x}O_y$ film is set to about 75 mole % or more, in particular, a range from about 86 mole % to 92 mole % or less. By doing so, it is expected to manufacture various semiconductor devices having a stable operation, in particular, various semiconductor memory devices using the $Hf_xAl_{1-x}O_y$ film as a capacitor insulating film.

As shown in FIG. 6, the following matter can be seen from the relationship between the leak current density and the Hf concentration. That is, the Hf concentration of the $Hf_xAl_{1-x}O_y$ film becomes high, and thereby, the relative dielectric constant of the $Hf_xAl_{1-x}O_y$ film increases. Thus, the leak current density of the $Hf_xAl_{1-x}O_y$ film in the same electric field strength decreases. As already described, the $Hf_xAl_{1-x}O_y$ film is a mixed crystal of $HfO_2$ having a relative dielectric constant $\in_r$=about 22 to 30 and $Al_2O_3$ having a relative dielectric constant $\in_r$=about 6 to 13. Therefore, the composition x of Hf is made large, and thereby, the relative dielectric constant $\in_r$ increases.

Figure 7:
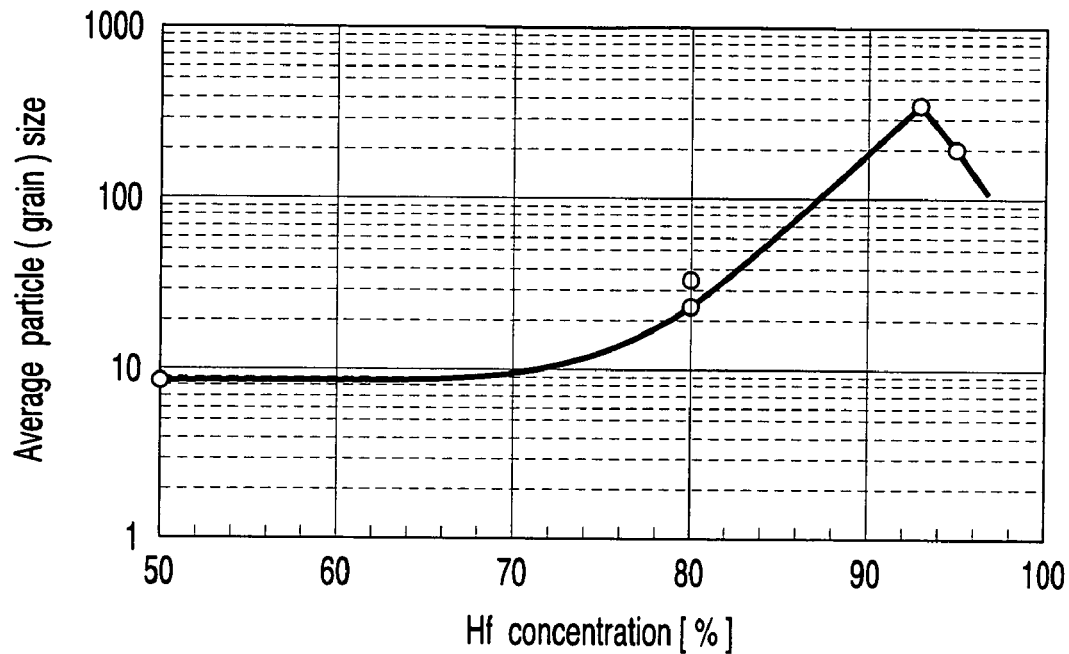
FIG. 7 is a graph showing a dependency of an average grain size with respect to Hf concentration (mole %) in the $Hf_xAl_{1-x}O_y$ film.

FIG. 7 is a graph showing the relationship between the Hf concentration of the $Hf_xAl_{1-x}O_y$ film and an average grain size of the $Hf_xAl_{1-x}O_y$ film. According to the graph of FIG. 7, the Hf concentration of the $Hf_xAl_{1-x}O_y$ film gradually increases, and thereby, the average grain size of the $Hf_xAl_{1-x}O_y$ film increases from about 10 nm to about 300 nm. The foregoing "average grain size" is an average value equivalent to "circle equivalent diameter" obtaining from observing a transmission electron microscope (TEM) photograph. Specifically, in FIG. 7, the Hf concentration of the $Hf_xAl_{1-x}O_y$ film and the average grain size thereof are calculated taking the following procedures.

Figure 12A:
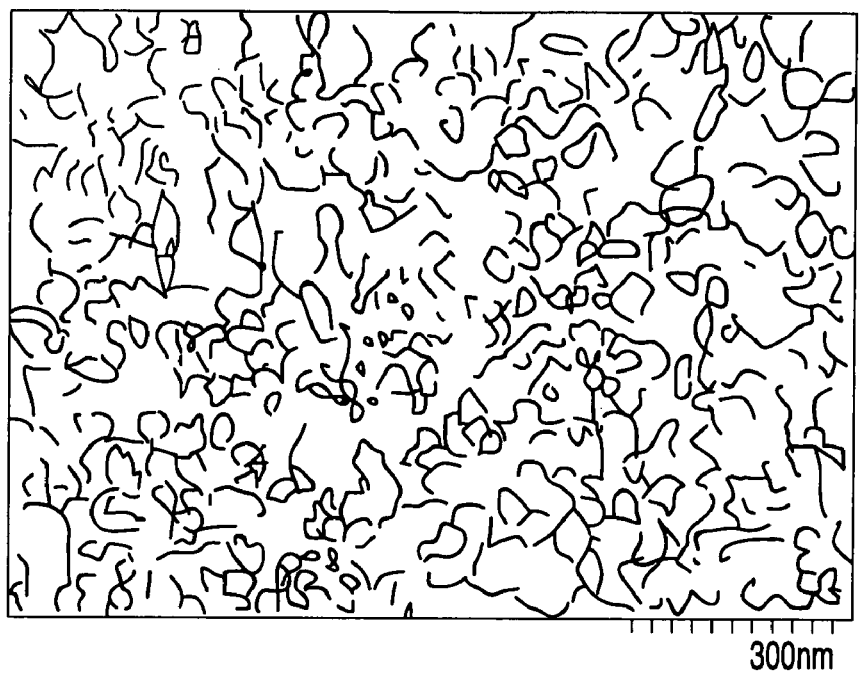
FIG. 12A is a schematic view sketching a grain boundary seen from a scanning transmission electron microscope (STEM) photography showing a plane (surface) of a $Hf_xAl_{1-x}O_y$ film grown in a gas introduction sequence of the number of HfO layers: the number of AlO layers=4:1.
Figure 12B:
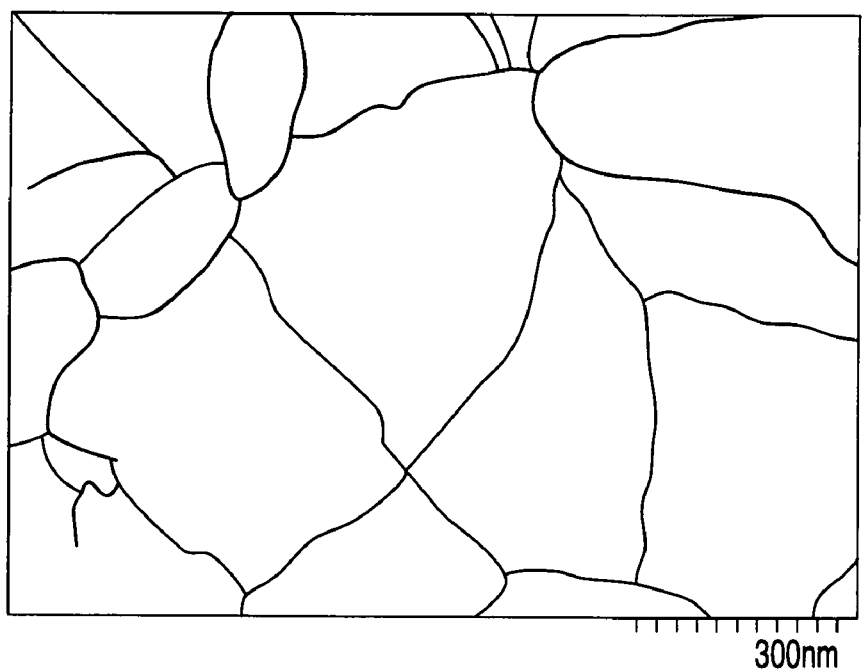
FIG. 12B is a schematic view sketching a grain boundary seen from a STEM photography showing a plane (surface) of a $Hf_xAl_{1-x}O_y$ film grown in a gas introduction sequence of the number of HfO layers: the number of AlO layers=13:1.

(1) About 100 grains (crystal grain) are extracted from an obtained TEM photograph at random (see FIG. 12A and FIG. 12B).

(2) The outer periphery (crystal boundary) of each grain thus extracted is traced. Then, the outer peripheral length obtained from the crystal boundary is regarded as a circular circumference of an "equivalent circle", which is an equatorial section when the crystal grain is given as a sphere.

(3) An equivalent diameter (circle equivalent diameter) of the crystal grain is calculated from the circular circumference of the equivalent circle of the crystal grain.

(4) The calculated equivalent diameter of the crystal grain is averaged to obtain a "average grain size" of the crystal grain.

In FIG. 7, when the Hf concentration of the $Hf_xAl_{1-x}O_y$ film is about 50 mole %, the average grain size of the $Hf_xAl_{1-x}O_y$ film is about 10 nm. When the Hf concentration is about 80 mole %, the average grain size of the $Hf_xAl_{1-x}O_y$ film is about 25 to 35 nm. When the Hf concentration is about 93 mole %, the average grain size of the $Hf_xAl_{1-x}O_y$ film becomes the maximum, that is, about 350 nm. When the Hf concentration further increases to about 95 mole %, the average grain size of the $Hf_xAl_{1-x}O_y$ film decreases to about 200 nm.

Figure 8:
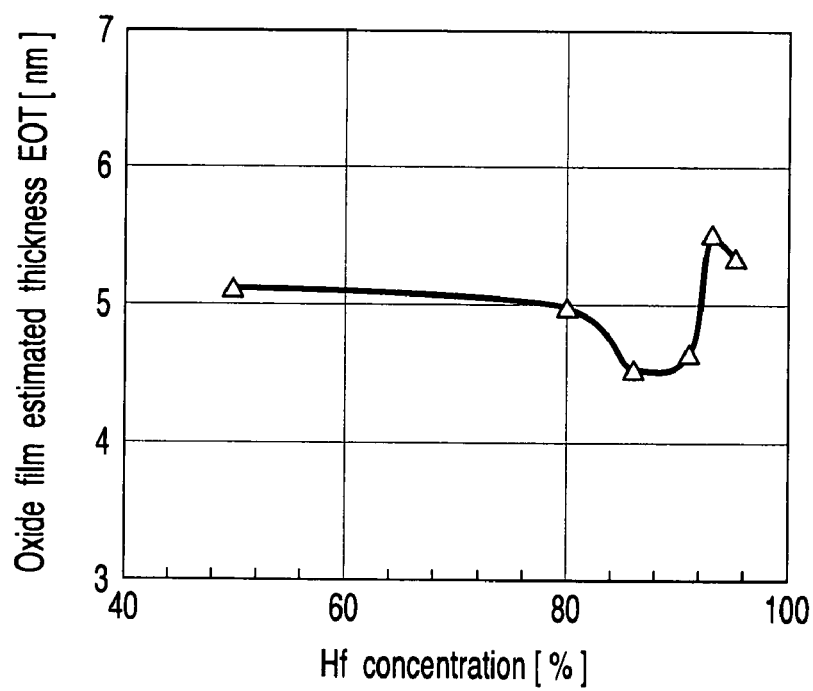
FIG. 8 is a graph showing a dependency of a silicon equivalent oxide thickness (EOT) with respect to Hf concentration (mole %) in the $Hf_xAl_{1-x}O_y$ film.

FIG. 8 is a graph showing the relationship between Hf concentration of the $Hf_xAl_{1-x}O_y$ film and a silicon oxide film (SiO2 film) equivalent oxide thickness (EOT). The EOT is obtained in the following manner. Specifically, a MOS capacitor using an $Hf_xAl_{1-x}O_y$ film having an area about 0.1 mm² as a capacitor insulating film is prepared. The C-V characteristic of the MOS capacitor is measured and calculated. The physical thickness of the $Hf_xAl_{1-x}O_y$ film is about 20 nm. As seen from FIG. 8, the Hf concentration of the $Hf_xAl_{1-x}O_y$ film gradually increases, and thereby, the EOT of the $Hf_xAl_{1-x}O_y$ film is reduced from about 5 nm to about 4.5 nm. In FIG. 8, when the Hf concentration of the $Hf_xAl_{1-x}O_y$ film is about 50 mole %, the EOT of the $Hf_xAl_{1-x}O_y$ film is about 5.1 nm. When the Hf concentration of the $Hf_xAl_{1-x}O_y$ film is about 80 mole %, the EOT of the $Hf_xAl_{1-x}O_y$ film is about 5.0 nm. When the Hf concentration of the $Hf_xAl_{1-x}O_y$ film is about 86 mole %, the EOT of the $Hf_xAl_{1-x}O_y$ film becomes the minimum value, that is, about 4.5 nm. Then, when the Hf concentration increases to about 93 mole %, and the EOT increases. Hf is added, and thereby, the EOT decreases. This means that a relative dielectric constant of the HfAlO film increases.

Usually, crystal defect and stress are collected in the periphery of the grain boundary. Therefore, it is difficult to form a necessary crystal structure. For this reason, a relative dielectric constant becomes low in the periphery of the grain boundary, and insulating characteristic is worsened. As depicted in FIG. 7, the Hf concentration is increased to make large the average grain size of the $Hf_xAl_{1-x}O_y$ film. By doing so, the grain boundary of the $Hf_xAl_{1-x}O_y$ film is reduced. The grain boundary of the $Hf_xAl_{1-x}O_y$ film is reduced, and thereby, the relative dielectric constant of the $Hf_xAl_{1-x}O_y$ film is improved; as a result, the EOT decreases. As described above, the Hf concentration of the $Hf_xAl_{1-x}O_y$ film gradually increases, and thereby, the relative dielectric constant of the $Hf_xAl_{1-x}O_y$ film increases. By doing so, it can be seen from FIG. 6 that the leak current of the $Hf_xAl_{1-x}O_y$ film is reduced. In other words, the leak current of the $Hf_xAl_{1-x}O_y$ film is reduced by setting the following condition. According to the condition, a mole ratio x of Hf and Al is set to a predetermined value, that is, about 0.75 or more, in particular, a range from about 0.86 or more to 0.92 or less.

Figure 9:
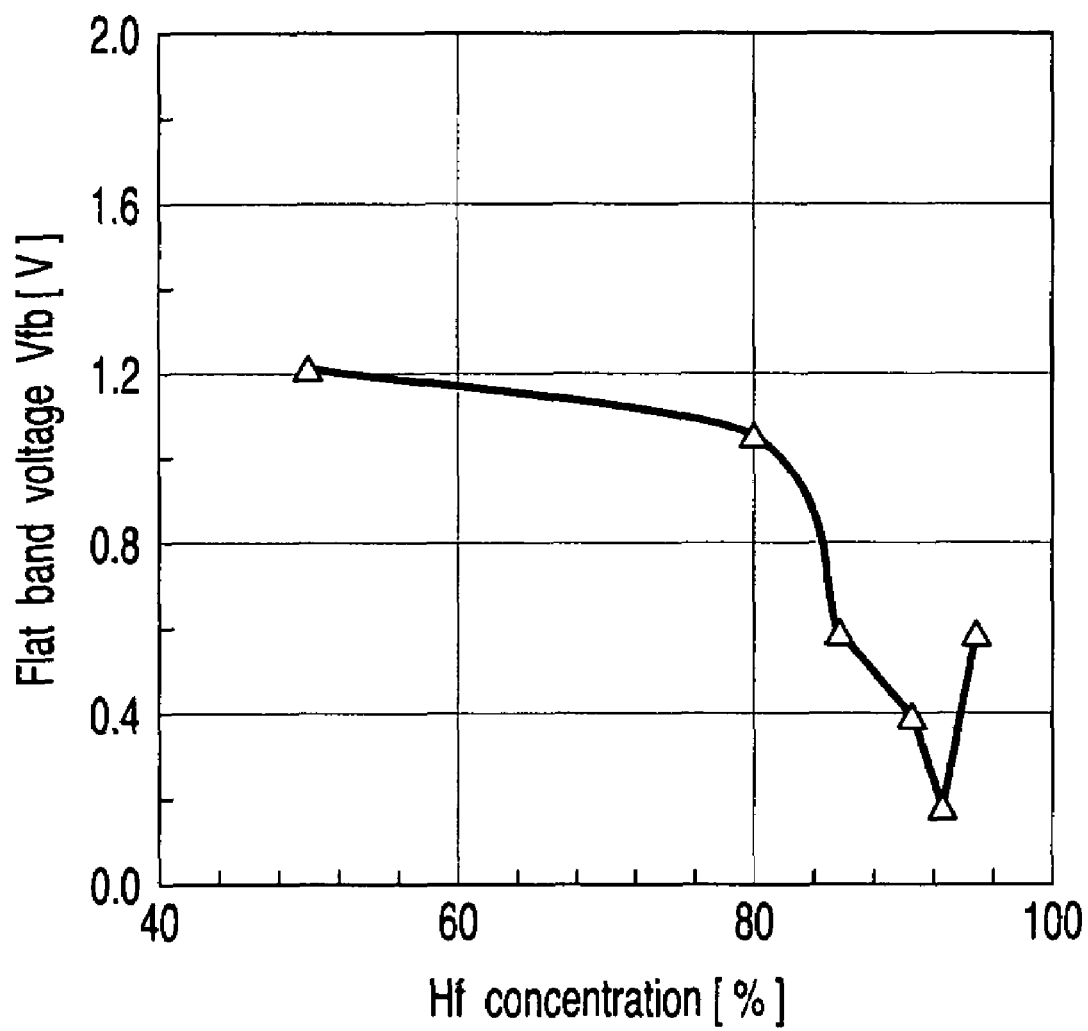
FIG. 9 is a graph showing a dependency of a flat band voltage obtained from C-V characteristic of a MOS diode using the $Hf_xAl_{1-x}O_y$ film as a capacitor insulating film with respect to Hf concentration (mole %)

FIG. 9 is a graph showing the relationship between Hf concentration of an $Hf_xAl_{1-x}O_y$ film at about 85° C. and a flat band voltage $V_{fb}$ of an $Hf_xAl_{1-x}O_y$ film. In FIG. 9, when the Hf concentration of the $Hf_xAl_{1-x}O_y$ film gradually increases, a flat band voltage $V_{fb}$ of the $Hf_xAl_{1-x}O_y$ film is reduced from about 5 nm to about 4.5 nm. The flat band voltage $V_{fb}$ is obtained in the following manner. Specifically, a MOS capacitor using an $Hf_xAl_{1-x}O_y$ film having an area of about 0.1 mm² as a capacitor insulating film is prepared. The flat band voltage $V_{fb}$ is obtained from the C-V characteristic of the MOS capacitor thus prepared. In FIG. 9, when the Hf concentration of the $Hf_xAl_{1-x}O_y$ film is about 50 mole %, the flat band voltage $V_{fb}$ of the $Hf_xAl_{1-x}O_y$ film is about 1.2V. When the Hf concentration of the $Hf_xAl_{1-x}O_y$ film is about 80 mole %, the flat band voltage $V_{fb}$ of the $Hf_xAl_{1-x}O_y$ film becomes about 1.05V. When the Hf concentration of the $Hf_xAl_{1-x}O_y$ film is about 86 mole %, the flat band voltage $V_{fb}$ of the $Hf_xAl_{1-x}O_y$ film is about 0.6V. When the Hf concentration of the $Hf_xAl_{1-x}O_y$ film is about 91 mole %, the flat band voltage $V_{fb}$ of the $Hf_xAl_{1-x}O_y$ film is about 0.4V. When the Hf concentration of the $Hf_xAl_{1-x}O_y$ film is about 93 mole %, the flat band voltage $V_{fb}$ of the $Hf_xAl_{1-x}O_y$ film becomes the minimum value, that is, about 0.2V. On the other hand, when the Hf concentration of the $Hf_xAl_{1-x}O_y$ film further increases to about 95 mole %, the flat band voltage $V_{fb}$ of the $Hf_xAl_{1-x}O_y$ film increases to about 0.6V.

Figure 10:
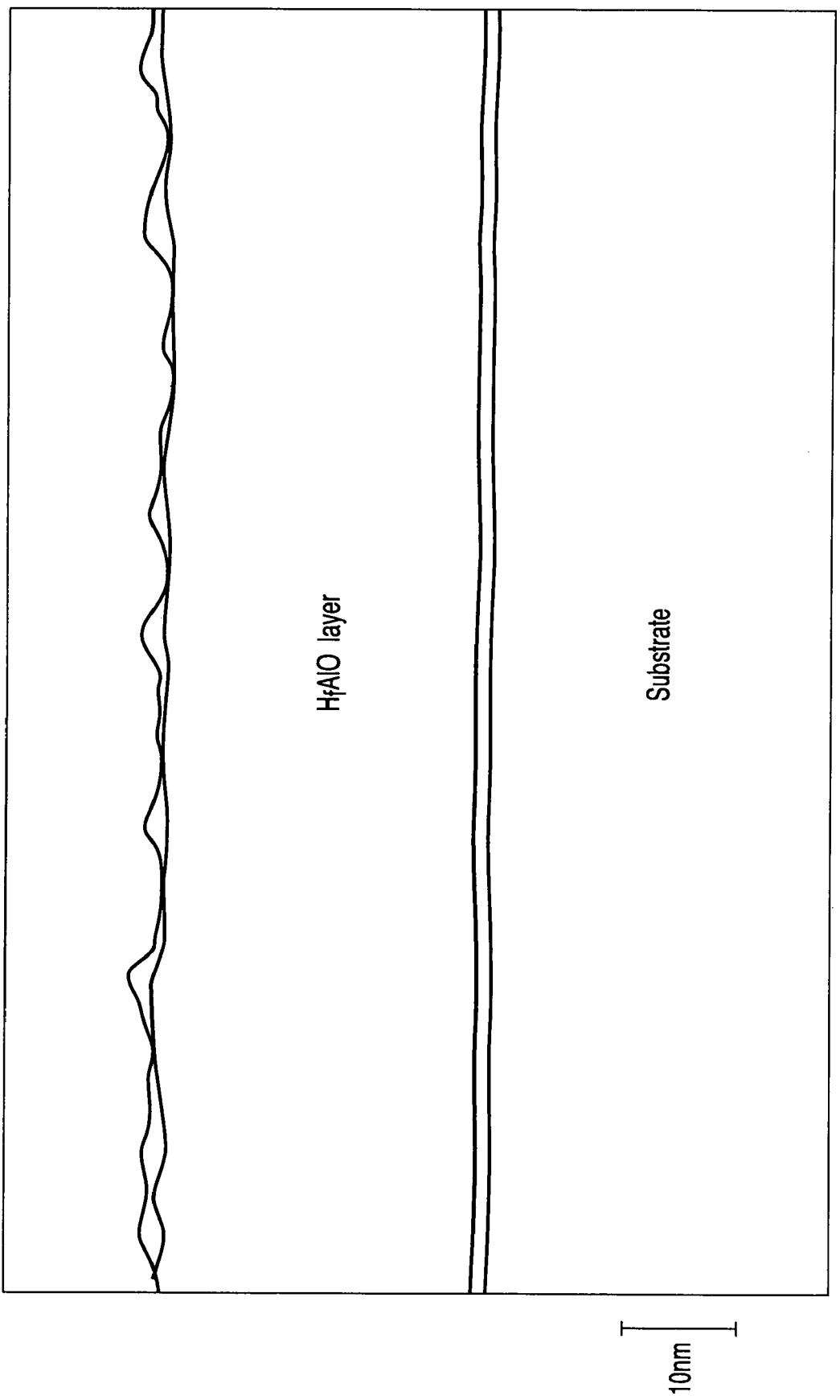
FIG. 10 is a schematic view sketching a sectional TEM photograph of a $Hf_xAl_{1-x}O_y$ film grown in a gas introduction sequence of the number of HfO layers: the number of AlO layers=19:1.
Figure 11:
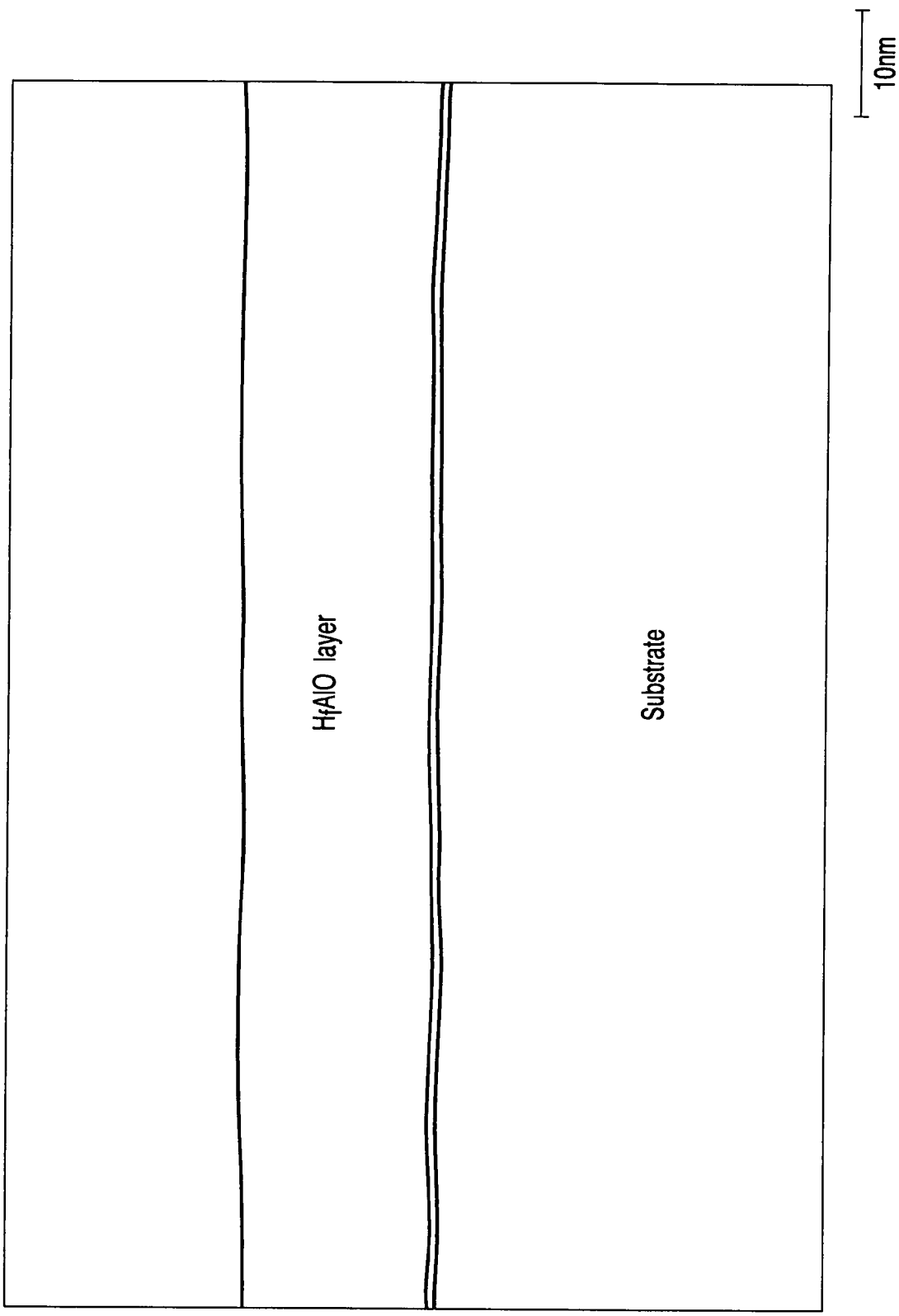
FIG. 11 is a schematic view sketching a sectional TEM photograph of a $Hf_xAl_{1-x}O_y$ film grown in a gas introduction sequence of the number of HfO layers: the number of AlO layers=13:1.

FIG. 10 is a view sketching a sectional TEM photography of an $Hf_xAl_{1-x}O_y$ film when a ratio q of the number of layers is about 0.95 (number of HfO layers: number of AlO layers=19:1). FIG. 11 is a view sketching a sectional TEM photography of an $Hf_xAl_{1-x}O_y$ film when a ratio q of the number of layers is about 0.93 (number of HfO layers: number of AlO layers=13:1).

FIG. 12A is a view sketching a crystal boundary seen from a scanning transmission electron microscope (STEM) photography of a plane (surface) of an $Hf_xAl_{1-x}O_y$ film when a ratio q of the number of layers is about 0.80 (number of HfO layers: number of AlO layers=4:1). On the other hand, FIG. 12B is a view sketching a crystal boundary seen from a STEM photography of a plane (surface) of an $Hf_xAl_{1-x}O_y$ film when a ratio q of the number of layers is about 0.93 (number of HfO layers: number of AlO layers=13:1). The surface morphology of the $Hf_xAl_{1-x}O_y$ film is improved when the ratio q of the number of layers is about 0.8 or more. The surface morphology of the $Hf_xAl_{1-x}O_y$ film becomes the best when the ratio q of the number of layers is about 0.93. When the ratio q of the number of layers becomes about 0.95 or more, the surface morphology of the $Hf_xAl_{1-x}O_y$ film is worsened. When the ratio q of the number of layers is about 0.95 or more, a relative dielectric constant as a substance of the $Hf_xAl_{1-x}O_y$ film increases. However, as seen from FIG. 10, the morphology of the $Hf_xAl_{1-x}O_y$ film is worsened; for this reason, an electric field is concentrated. As a result, the leak current of the $Hf_xAl_{1-x}O_y$ film increases.

In view of data shown in FIG. 6 to FIG. 12A and FIG. 12B, the leak current of the $Hf_xAl_{1-x}O_y$ film considerably decreases in a range where the ratio q of the number of layers is more than about 0.8. The leak current of the $Hf_xAl_{1-x}O_y$ film becomes the smallest in a range where the ratio q of the number of layers is about 0.9 more than and less than 0.95.

When the ratio q of the number of layers is more than about 0.95, the leak current of the $Hf_xAl_{1-x}O_y$ film again increases.

In the semiconductor device (non-volatile semiconductor memory device) according to the first embodiment, the composition x of Hf of the $Hf_xAl_{1-x}O_y$ film is set to the following range, in particular. Specifically, the composition x is set to the range from about 0.8 or more, in particular, a range from about 0.90 or more to 0.95 or less. By doing so, even if the field strength applied to the $Hf_xAl_{1-x}O_y$ film becomes high, it is possible to provide a semiconductor device, which can sufficiently restrict the leak current flowing through the $Hf_xAl_{1-x}O_y$ film. (Strictly, the composition x must be calibrated considering the following relationship. It is the relationship between the ratio q of the number of stacked layers of HfO (layer number) to the total number of stacked layers (layer number) and the Hf concentration (mole %) of the $Hf_xAl_{1-x}O_y$ film measured by the induction coupling plasma (ICP) emission analyzer in the gas introduction sequence shown in FIG. 5.)

Next, a method of manufacturing the semiconductor device according to the first embodiment of the present invention will be hereinafter described with reference to FIG. 13 to FIG. 24. In this case, FIG. 13 to FIG. 21 is a cross-sectional view parallel to the word lines $WL1_k$, $WL2_k$, ... $WL32_k$, $WL1_{k-1}$ ... shown in FIG. 2, and cutting a specific word line. FIG. 22 to FIG. 24 is a cross-sectional view parallel to bit lines $BL_{2j-1}$, $BL_{2j}$, $BL_{2j+1}$, ... corresponding to the A-A direction of FIG. 2. The following method of manufacturing a non-volatile semiconductor memory device is one example. Of course, various modifications may be made, and according to various manufacturing methods other than above, the non-volatile semiconductor memory device is realizable.

(1) A first insulating film 12p having a thickness of about 1 to 15 nm is formed on a p-type silicon substrate 11 (or well formed in an n-type silicon substrate). Using a low pressure CVD process, polysilicon is formed to have a thickness of about 10 to 200 nm. This polysilicon formed as a first conductive layer 13p functioning as part of the floating gate electrode (13, 19) shown in FIG. 3. Thereafter, a silicon nitride film 14p is deposited (coated) on the first conductive layer 13p to have a thickness of about 50 to 200 nm using a low pressure CVD process. By doing so, a silicon oxide film 15p is formed on the silicon nitride film 14p to have a thickness of about 50 to 400 nm. Then, a photo resist film is coated on the silicon oxide film 15p, and thereafter, patterned using a photolithography technique. In the manner described above, a resist mask 16 shown in FIG. 13 is formed.

(2) The silicon oxide film 15p is selectively etched using the resist mask 16 to form a pattern of the silicon oxide film 15. After etching, the resist mask 16 is removed. The foregoing silicon nitride film 14p, first conductive layer 13p and first insulating film 12p are continuously etched using the pattern of the silicon oxide film 15 as a mask. By doing so, a first insulating film 12, a first conductive layer 13, a silicon nitride film 14 and a silicon oxide film 15 are successively stacked, and then, a stacked pattern is formed. Further, continuous etching is continued to etch the silicon substrate 11, and resist is removed after etching. By doing so, as seen from FIG. 14, an isolation trench 31 is formed in the silicon substrate 11. In FIG. 14, the isolation trenches 31 vertically extend in parallel with each other, and are formed like stripe. A convex portion comprising the semiconductor substrate via the isolation trenches 31 at its both ends functions as an active area (AA). After etching, oxidization process after high temperature is carried out to remove a sectional damage given by etching. In order to form the isolation trench 31, a stacked film comprising the silicon nitride film 14 and the silicon oxide film 15 is used as a mask. In this case, the film thickness and reactive ion etching conditions are properly set. By doing so, even if any of a single-layer silicon nitride film, a single-layer silicon oxide film or other single/multi-layer film is used, etching is possible so long as they are materials taking selectivity with silicon.

Figure 15:
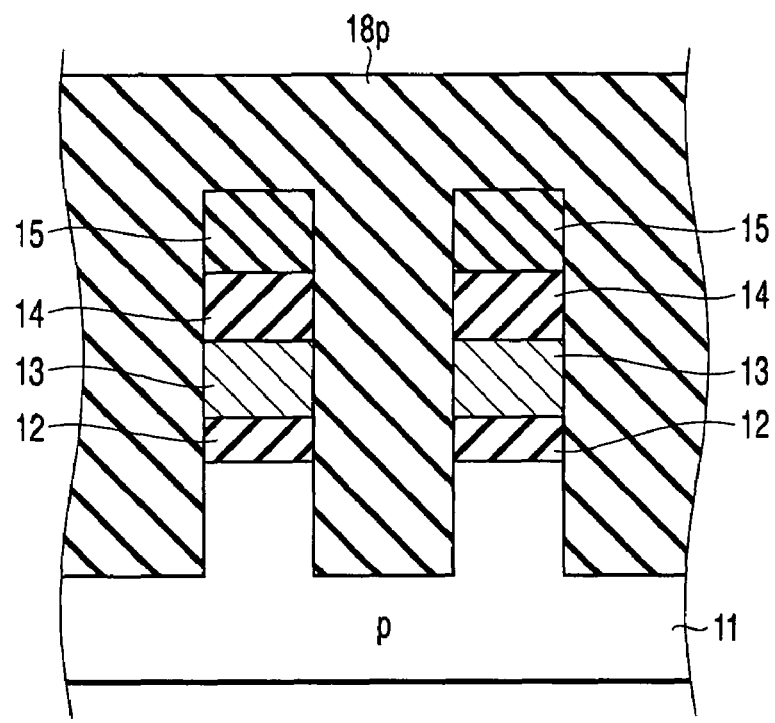
FIG. 15 is a process sectional view to explain the method of manufacturing the semiconductor device according to the first embodiment of the present invention.
Figure 16:
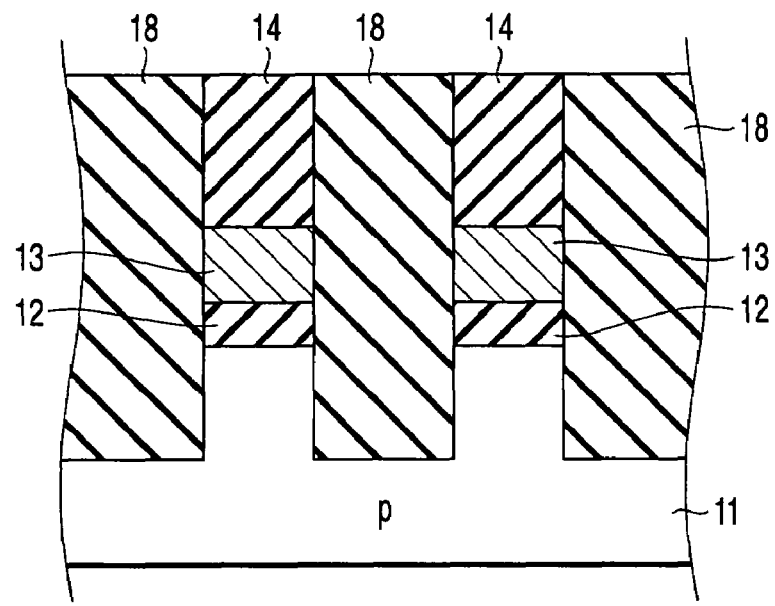
FIG. 16 is a process sectional view to explain the method of manufacturing the semiconductor device according to the first embodiment of the present invention.
Figure 17:
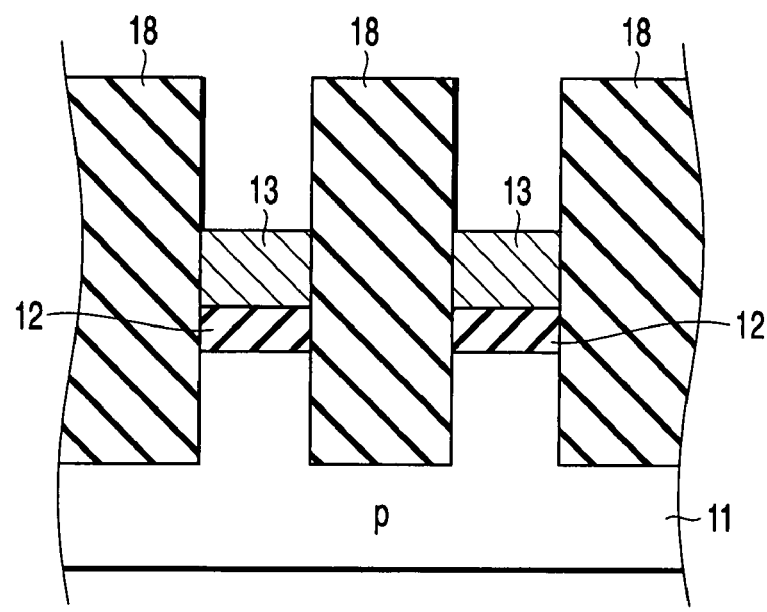
FIG. 17 is a process sectional view to explain the method of manufacturing the semiconductor device according to the first embodiment of the present invention.

(3) Thereafter, as shown in FIG. 15, the isolation trench 31 is filled with an insulating film such as a silicon oxide film having a thickness about 200 to 1500 nm. Then, high-temperature heat treatment is carried out in a nitrogen or oxygen atmosphere to obtain high density. Further, using chemical mechanical polishing (CMP), planarization is carried out using the silicon nitride film 14 as a stopper as illustrated in FIG. 16 to fill the isolation insulating film 18. Thereafter, and the silicon nitride film 14 are selectively removed using etchant capable of etching at higher selectively together with the isolation insulating film 18. By doing so, a sectional structure shown in FIG. 17 is obtained. For example, if the silicon oxide film is used as the isolation insulating film 18, hot phosphorus acid is usable to etch the silicon oxide film and the silicon nitride film 14 at high selectively.

Figure 18:
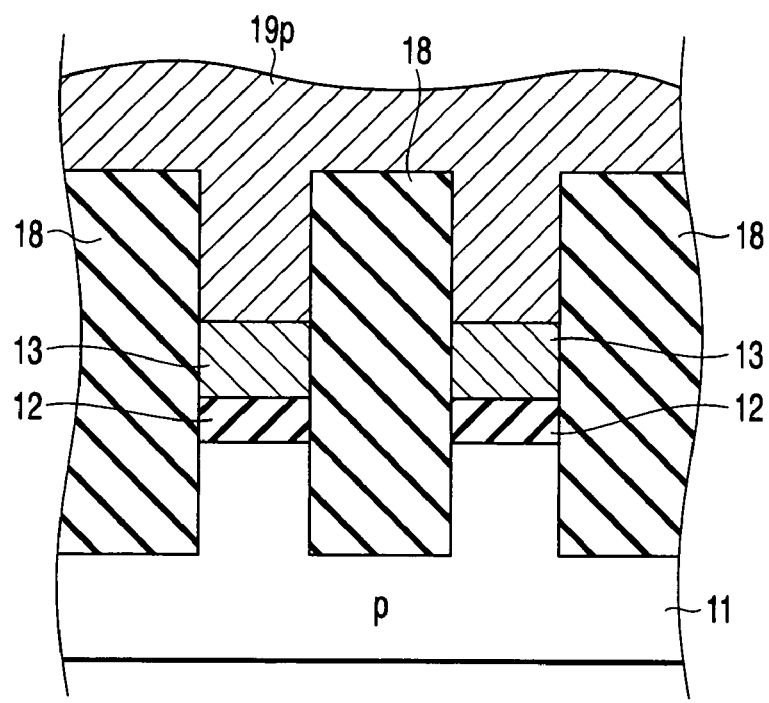
FIG. 18 is a process sectional view to explain the method of manufacturing the semiconductor device according to the first embodiment of the present invention.

(4) Using a thin film forming process (deposition process) excellent in step coverage, a polysilicon second conductive layer 19p is deposited on the trench obtained after removing the silicon nitride film 14 as depicted in FIG. 18. In this case, the polysilicon second conductive layer 19p functions as another part of the floating gate electrode (13, 19) shown in FIG. 3. Then, the second conductive layer 19p is planarized using the buried insulating film 18 as a stopper via CMP. By doing so, a pattern of a second conductive layer 19 is filled in the trench obtained after removing the silicon nitride film 14 as seen from FIG. 19.

Figure 19:
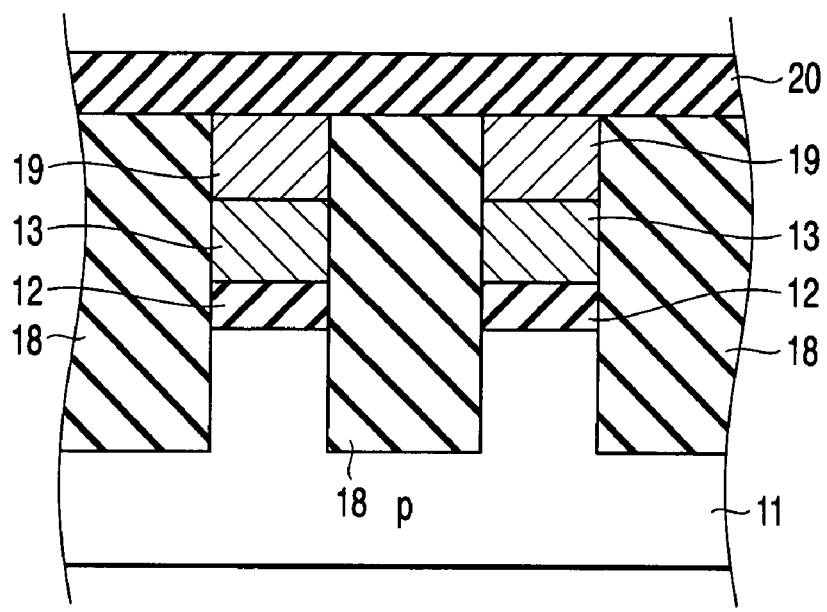
FIG. 19 is a process sectional view to explain the method of manufacturing the semiconductor device according to the first embodiment of the present invention.
Figure 20:
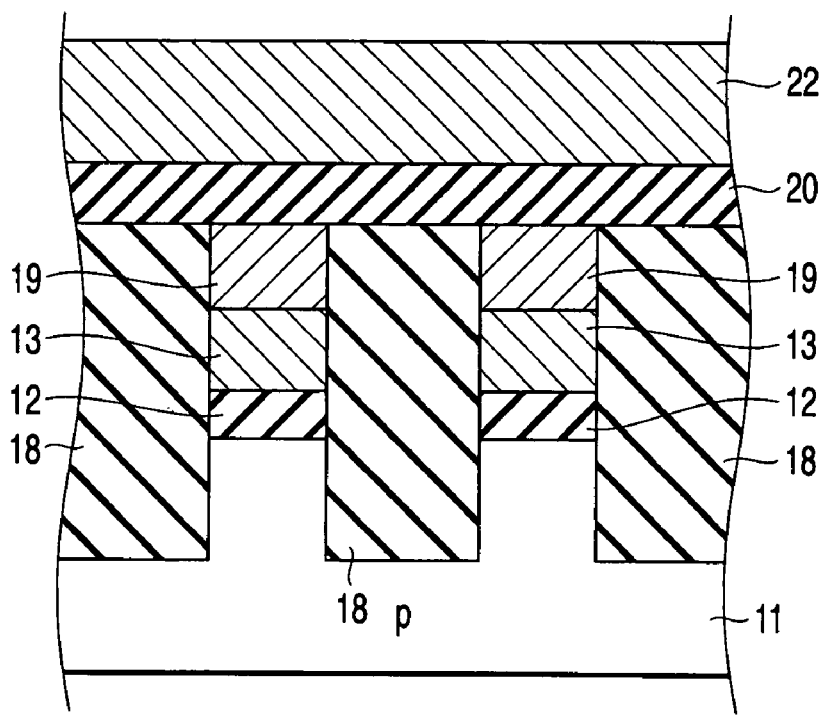
FIG. 20 is a process sectional view to explain the method of manufacturing the semiconductor device according to the first embodiment of the present invention.

(5) As illustrated in FIG. 19, a $Hf_xAl_{1-x}O_y$ film is formed as a second insulating film 20 on the planarized pattern of the second conductive layer 19 using an ALD (MLD) process. As depicted in FIG. 20, a CVD conductive layer 22p is formed on the second insulating film 20. In this case, the CVD conductive layer 22p functions as the control gate electrode (CVD control gate electrode) 22 shown in FIG. 3. Further, the CVD conductive layer 22p is formed in such a manner that polysilicon is deposited to have a thickness of about 10 to 200 nm using a low pressure CVD process. The CVD conductive layer 22p is formed, and thereafter, post deposition annealing (PDA) is carried out under the following conditions. According to the conditions, the temperature is about 500 to 1200° C., the resultant is put in a resistance heat furnace for about ten minutes to two hours, and in a lamp anneal furnace for about one second to 30 minutes. The foregoing PDA is carried out, and thereby, densification (high density) of the second insulating film 20 is made. As a result, the film quality is dense, and modified. The foregoing densification (high density) serves to reduce the film thickness about 10%.

(6) Thereafter, a photo resist film 24 is coated on the CVD conductive layer 22p, and then, patterned using photolithography to form a pattern of a photo resist film 24 shown in FIG. 21. Thereafter, the foregoing CVD conductive layer 22p, inter-electrode insulating film (second insulating film) 20, second conductive layer 19, first conductive layer 13 and gate insulating film (first insulating film) 12 are etched via RIE. In this case, these layers and films are selectively etched using the pattern of the photo resist film 24 as cell isolation etching mask in column until the silicon substrate 11 is exposed. By doing so, a plurality of slit-like cell isolation trenches extending to the row direction (word line direction) is formed. As seen from FIG. 22, a memory cell transistor is isolated in the cell column. (The sectional structure shown in FIG. 22 is a section viewing from the A-A direction vertical to the paper of FIG. 21. In other words, FIG. 13 to FIG. 21 is a section parallel to the word lines shown in FIG. 2, $WL1_k$, $WL2_k$, ... $WL32_k$, $WL1_{k-1}$ ... and cutting a specific word line. In the following FIG. 22 to FIG. 24 are a sectional view parallel to the bit lines $BL_{2j-1}$, $BL_{2j}$, $BL_{2j+1}$, ... corresponding to the A-A direction of FIG. 2.) In each cell column, the control gate electrode (CVD control gate electrode) 22 of each memory cell transistor is isolated from the floating gate electrode (13, 19) comprising the first and second conductive layers 13 and 19 via the cell isolation trench. Although no illustration is made, the select transistor is isolated from the memory cell transistor via cell isolation trench in the column direction.

(7) An n-type impurity ion such as arsenic ion ($^{75}As^+$) or phosphorus ion ($^{31}P^+$) is implanted the semiconductor substrate 11 exposed via the cell isolation trench in self-align, as shown in FIG. 23. In this case, the stacked layer structure (12, 13, 19, 20, 22) isolated from each other via the cell isolation trench is used as a mask. Specifically, 12 is the gate insulating film (first insulating film), 13 is the first conductive layer, 19 is the second conductive layer, 20 is the inter-electrode insulating film (second insulating film) and 22 is the control gate electrode (CVD control gate electrode). Before ion implantation, the stacked layer structure is heated at about 800° C. for about 120 seconds in a nitrogen atmosphere, and further, heated at about 1000° C. in an oxidization atmosphere. By doing so, a front-end film comprising a silicon oxide film having a thickness of 6 nm is formed at the following portions. One is a surface of the semiconductor substrate 11. Another is a sidewall exposed from the cell isolation trench of the control gate electrode (CVD control gate electrode. Another is a sidewall exposed from the cell isolation trench of the floating gate electrode (13, 19). The ion may be implanted via the foregoing front-end film.

(8) After ion implantation, the surface of the semiconductor substrate 11 is formed with a source/drain region 25 via activation annealing, and thereby, each memory cell transistor is configured. A SiOF film is deposited as an interlayer insulating film 26 via an HDP process using diphloro silane gas ($SiH_2F_2$ gas). By doing so, as seen from FIG. 24, the film 26 is filled in a space between memory cell transistors isolated from each other via the cell isolation trench and in a space between the memory cell transistor and the select transistor (not shown). A new photo resist film is coated on the entire surface, and thereafter, a new photo resist film is patterned using a normal photolithography. A via hole (contact hole) is opened between two select transistors via a RIE process using the new photo resist film as an etching mask. A contact plug comprising a conductor such as tungsten is buried in the contact hole using sputtering, vacuum deposition and CVD processes. Further, a metal film (conductor film) is deposited using sputtering, vacuum deposition and CVD processes. Then, the metal film (conductor film) is patterned using photolithography and RIE (or damascene technique). By doing so, the bit line 27 shown in FIG. 3 is wired, and thereby, the semiconductor device according to the first embodiment is completed. In FIG. 3, although no illustration is made, an insulating film such as a silicon nitride film and polyimide film may be formed as a passivation film on the bit line 27. This is the same as the process of manufacturing a normal NAND flash memory.

As described above, the method of manufacturing the semiconductor device according to the first embodiment has the following advantage. Specifically, even if the applied field strength becomes high, it is possible to a method of manufacturing a semiconductor memory device including a high relative dielectric constant insulating film ($Hf_xAl_{1-x}O_y$ film) sufficiently restricting a leak current. In particular, the concentration (composition) of the $Hf_xAl_{1-x}O_y$ film is optimized to satisfy the conditions. According to the conditions, the composition x is set to a range of about $0.8 \leq x \leq$ about 0.95, preferably about $0.9 \leq x \leq$ about 0.95. Moreover, a ratio of the number of HfO stacked layer times (layer number) to the total number of stacked layer times (layer number) is optimized. By doing so, it is possible to provide a semiconductor memory device, which is excellent in uniformity and mass production, and is hard to receive damage during a manufacturing process.

According to the method of manufacturing the semiconductor device of the first embodiment, a doped silicon film is used as the control gate electrode (CVD control gate electrode) 22. As described above, various conductive materials such as metal, that is, Ti or TiN or metal nitride film are usable as the control gate electrode (CVD control gate electrode) 22.

Second Embodiment

The high relative dielectric constant insulating film such as the $Hf_xAl_{1-x}O_y$ film described in the first embodiment has the following tendency. Specifically, inter-atomic bonding becomes inactive as compared with the silicon oxide film ($SiO_2$ film), and the high relative dielectric constant insulating film is easy to be reduced in a reducing atmosphere. For this reason, there is the following problem if doped silicon is used as the top control gate electrode of the high relative dielectric constant insulating film. Namely, if a CVD process using normal monosilane ($SiH_4$) as a material is employed, the doped silicon receives damage such as oxygen defect by reduction of $SiH_4$. Moreover, in order to etch the high relative dielectric constant insulating film, an etching gas having reduction such as boron trichloride ($BCl_3$) is used. For this reason, BO is generated during etching, the end face of the etched high relative dielectric constant insulating film has oxygen defect. A leak current of a high relative dielectric constant capacitor is mainly generated at a portion having the foregoing two damages. A charge stored in the capacitor is proportional to an area of capacitor, that is, square of one side length thereof. On the other hand, the area of the damage layer is proportional to the peripheral length of the capacitor, that is, one side length thereof. For this reason, if the capacitor area is large, there is no problem because a ratio of a leak pass in the capacitor area is not high. However, the capacitor area is reduced with the scale-down, and thereby, a ratio of the leak pass depending on the capacitor peripheral length relatively increases. As a result, the damage layer of oxygen defect becomes a serious problem. According to the second embodiment, there is provided a semiconductor memory device, which can solve the foregoing problem, and to provide a method of manufacturing the same.

Figure 25:
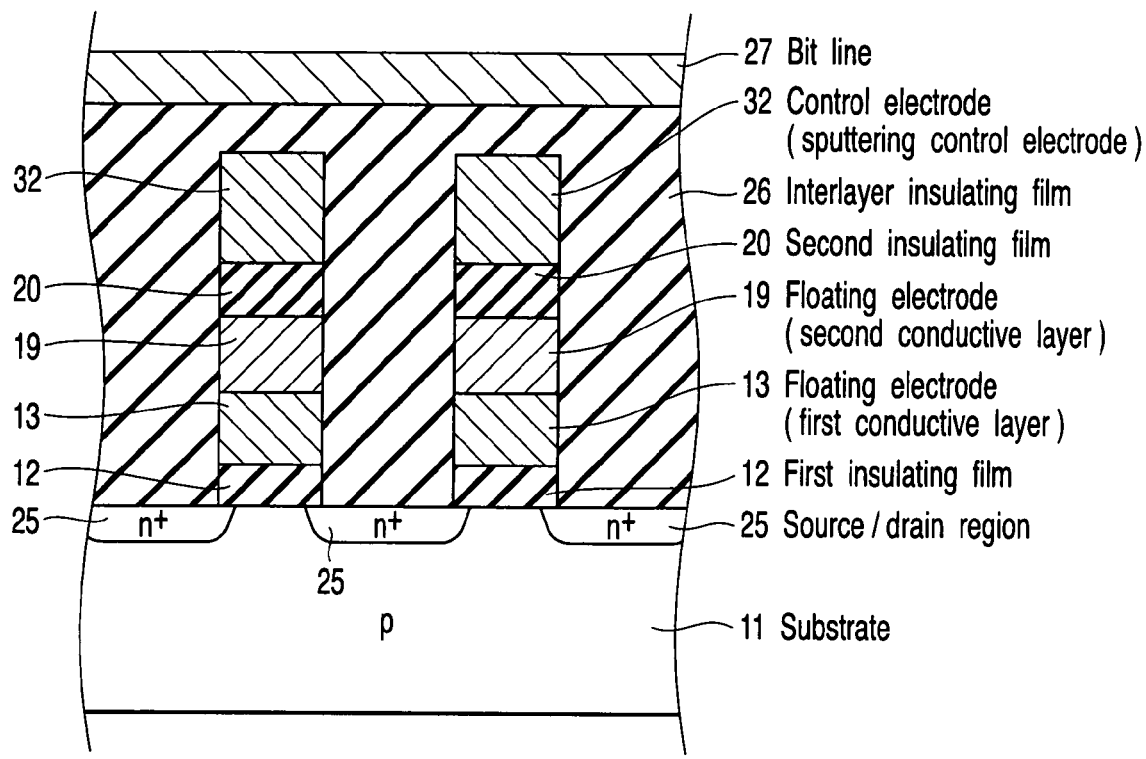
FIG. 25 is a cross-sectional view cut along a bit line direction (A-A direction) of FIG. 2, and showing part (NAND cell column) of a memory cell array of a semiconductor device (non-volatile semiconductor memory device) according to a second embodiment of the present invention.

FIG. 25 is a cross-sectional view to explain a semiconductor device according to a second embodiment of the invention, equivalent to the structure when viewing from the A-A direction of FIG. 2 showing a plan view of a NAND type non-volatile semiconductor memory device (flash memory) of the first embodiment. In other words, FIG. 25 is equivalent to the sectional structure cut along the bit lines $BL_{2j-1}$, $BL_{2j}$, $BL_{2j+1}$, ... direction of FIG. 1.

As shown in the sectional view of FIG. 25, a semiconductor device according to the second embodiment is formed in the same manner as the semiconductor device (non-volatile semiconductor memory device) according to the first embodiment. A surface of a p-type semiconductor substrate 11 is formed with a source/drain region 25 of a memory cell transistor. A gate insulating film (first insulating film) 12 is formed on a channel region defined between the source/drain region 25. The source/drain region 25 is an n⁺ type semiconductor region doped with an n type impurity in a p type semiconductor substrate 11 at high concentration.

The following components are formed on the gate insulating film (first insulating film) 12. One is a floating gate electrode (13, 19) for storing a charge. Another is an inter-electrode insulating film (second insulating film) 20 formed on the floating gate electrode (13, 19). Another is a control gate electrode (sputtering control gate electrode) 32 formed on the inter-electrode insulating film (second insulating film) 20. These components form a gate electrode of each memory cell transistor. The control gate electrode (sputtering control gate electrode) 32 differs from the CVD control gate electrode 22 of the semiconductor device according to the first embodiment. The control gate electrode 32 is a conductive layer formed on the inter-electrode insulating film (second insulating film) 20 using a sputtering process. The following materials are usable as the control gate electrode (sputtering control gate electrode) 32 formed using a sputtering process. In addition to doped silicon, metals having high melting point such as W, Co, Ti and Mo, metal silicide films such as $WSi_2$, $CoSi_2$, $TiSi_2$ and $MoSi_2$, polycide film using these silicide films or metal nitride films such as WN, TiN and $Ti_2N$ or a stacked layer film combining those are given.

On the other hand, the floating gate electrode (13, 19) functioning as a charge storage layer has the following two-layer structure like the semiconductor device according to the first embodiment. One is a first conductive layer 13 comprising a doped silicon film. Another is a second conductive layer 19 comprising a doped silicon film.

The high relative dielectric constant insulating film is preferably used as the inter-electrode insulating film (second insulating film) 20 like the semiconductor device according to the first embodiment. Specifically, a relative dielectric constant of a silicon oxide film ($SiO_2$ film) is larger than about 3.8 to 4, and in particular, about 5 to 5.5 of the relative dielectric constant used in the conventional ONO film. In the semiconductor device according to the first embodiment, the $Hf_xAl_{1-x}O_y$ film is used as the foregoing high relative dielectric constant insulating film. The $Hf_xAl_{1-x}O_y$ film contains $Al_2O_3$ and $HfO_2$. The following oxide films are usable in addition to the foregoing oxides. For example, magnesium oxide (MgO) film having $\in_r$=about 10, yttrium oxide film ($Y_2O_3$ film) having $\in_r$=about 16 to 17, zirconium oxide film ($ZrO_2$ film) having $\in_r$=about 22 to 23, tantalum oxide film ($Ta_2O_5$ film) having $\in_r$=about 25 to 27, bismuth oxide film ($Bi_2O_3$ film) having $\in_r$=about 40, strontium oxide film ($SrO_2$) and lanthanum oxide ($La_2O_3$) are given. A single layer film using any one of these oxides or a compound film stacking these oxides is usable. The foregoing $Ta_2O_5$ and $Bi_2O_3$ are lacking for thermal stability in the interface with polysilicon. Further, a compound film mixing the silicon oxide film and those is usable, and an insulating film comprising a ternary compound having the same mixed crystal as the $Hf_xAl_{1-x}O_y$ film is usable. In other words, oxides containing at least any one of the following elements are usable as the high relative dielectric constant insulating film used as the inter-electrode insulating film (second insulating film) 20. As the elements, aluminum (Al), magnesium (Mg), yttrium (Y), hafnium (Hf), zirconium (Zr), tantalum (Ta), bismuth (Bi), strontium (Sr) and lanthanum (La) are given. Titanic acid strontium ($SrTiO_3$) as a ferroelectric material and barium titanic acid strontium ($BaSrTiO_3$) are usable as the material for the high relative dielectric constant insulating film. However, these are lacking for thermal stability in the interface with polysilicon, and consideration must be made with respect to hysteresis characteristic of the ferroelectric material.

As is evident from the sectional view along the bit line shown in FIG. 25, the floating gate electrode (13, 19) of each memory cell transistor face via the interlayer insulating film 26 in the semiconductor device of the second embodiment. The interlayer insulating film 26 having a relative dielectric constant $\in_r$ lower than about 3.9 is filled between the floating gate electrodes (13, 19) of a plurality of memory cell transistors arrayed in the column direction. By doing so, it is possible to prevent write error resulting from column direction proximity cell interference occurring between neighboring memory cell transistors in the column direction in the same column. In FIG. 25, although the structure is not detailedly shown, a cell isolation front-end film comprising a silicon oxide film having a thickness of about 6 nm may be formed at a sidewall of a stacked-layer structure (13, 19, 20, 32) comprising the following films. That is, 13 is the first polysilicon film (first conductive layer), 19 is the second polysilicon film (first conductive layer), 20 is the inter-electrode insulating film (second insulating film) and 32 is the control gate electrode (sputtering control gate electrode). A two-layer structure of the interlayer insulating film 26 and a core filling insulating film may be used between select transistors in the cell column adjacent to the row direction. For example, a BPSG film is usable as the core filling insulating film. Specifically, the core filling insulating film is formed to fill the center of a recess of the interlayer insulating film 26. A contact plug is buried through the center portion of the core filling insulating film. The contact plug has a low resistance, and has ohmic-contact with a bit line contact region (not shown). The contact plug is connected to the bit line ($BL_{2j}$) 27 formed on the interlayer insulating film 26. In FIG. 25, the bit line 27 is formed on the interlayer insulating film 26. In this case, the interlayer insulating film 26 is formed with a damascene trench, and metal interconnect consisting of mainly copper (Cu) is buried in the damascene trench. By doing so, a damascene interconnection is given.

In the semiconductor device (non-volatile semiconductor memory device) according to the second embodiment of the invention, the control gate electrode (sputtering control gate electrode) 32 is formed on the inter-electrode insulating film (second insulating film) 20 using a sputtering process. Therefore, this serves to prevent a generation of damage such as oxygen defect by reducing gas.

As described above, a charge stored in a capacitor is proportional to an area of the capacitor, that is, square of one side length of the capacitor. On the other hand, an area of the damage layer is proportional to a peripheral length of a capacitor, that is, one side length of the capacitor. However, the semiconductor device (non-volatile semiconductor memory device) according to the second embodiment of the invention has the following advantage. Specifically, even if the peripheral length of the capacitor to the capacitor area relatively increases with the scale-down of the non-volatile semiconductor memory device, there is no problem of the damage layer such as oxygen defect.

Figure 26:
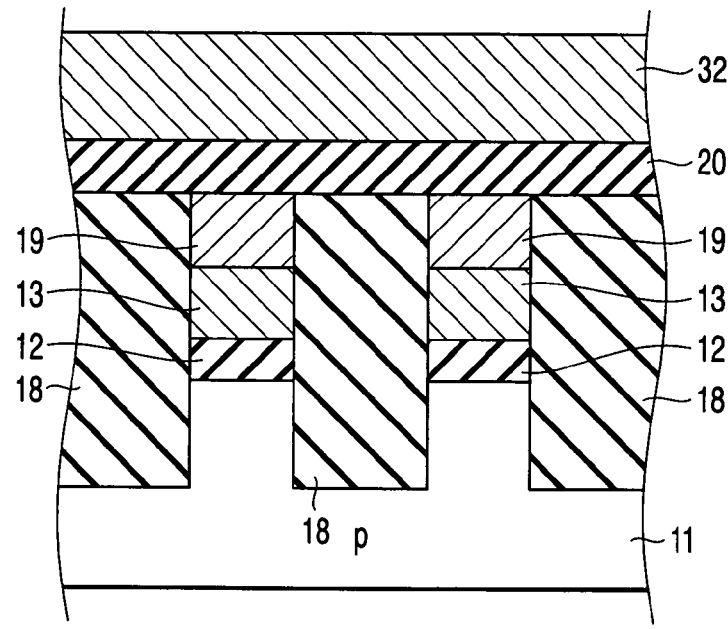
FIG. 26 is a process sectional view to explain a method of manufacturing the semiconductor device according to the second embodiment of the present invention.

A method of manufacturing the semiconductor device according to the second embodiment of the invention will be hereinafter described with reference to FIG. 26 to FIG. 30. FIG. 26 and FIG. 27 are cross-sectional views parallel to word lines $WL1_k$, $WL2_k$, . . . $WL32_k$, $WL1_{k-1}$, . . . and cutting a specific word line. FIG. 28 to FIG. 30 is a cross-sectional view parallel to the bit lines $BL_{2j-1}$, $BL_{2j}$, $BL_{2j+1}$, . . . corresponding to the A-A direction of FIG. 2. According to the method of manufacturing the semiconductor device of the second embodiment, the inter-electrode insulating film (second insulating film) 20 is not limited to the $Hf_xAl_{1-x}O_y$ film. For convenience, an explanation is made using the $Hf_xAl_{1-x}O_y$ film as the inter-electrode insulating film (second insulating film) 20 of the semiconductor device according to the second embodiment of the invention. In the following method of manufacturing the semiconductor device of the second embodiment, an overlapping explanation with the method of manufacturing the semiconductor device of the first embodiment is omitted. Specifically, a process shown in the FIG. 26 until the $Hf_xAl_{1-x}O_y$ film as the second insulating film 20 is formed on the pattern of the planarized second conductive layer 19 is the same as the process described using FIG. 13 to FIG. 18 of the first embodiment. Other various high relative dielectric constant insulating films excepting the $Hf_xAl_{1-x}O_y$ film may be used. Of course, like the method of manufacturing the semiconductor device according to the first embodiment, the following method of manufacturing the semiconductor device according to the second embodiment is one example. Including modification examples, the semiconductor device is realizable according to various manufacturing methods excepting this.

(1) Via a series of the process described in FIG. 13 to FIG. 17 of the first embodiment, the second conductive layer 19p comprising polysilicon shown in FIG. 18 is deposited on a trench obtained after removing the silicon nitride film 14 of FIG. 17. The second conductive layer 19p is a conductive layer functioning as part of the floating gate electrode (13, 19) shown in FIG. 25 in the method of manufacturing the semiconductor device according to the second embodiment. Then, the second conductive layer 19p is planarized via CMP using a buried insulating film 18 as a stopper. A pattern of the second conductive layer 19p is filled in a trench formed after removing the silicon nitride film 14. Thereafter, as depicted in FIG. 26, a control gate electrode (sputtering control gate electrode) 32 is formed on the second insulating film 20 using a sputtering process. According to the method of manufacturing the semiconductor device of the second embodiment, a doped polysilicon film is used as the control gate electrode (sputtering control gate electrode) 32. The doped polysilicon film used as the control gate electrode (sputtering control gate electrode) 32 is formed in the following manner. Specifically, phosphorus (P) is used as a target, and a DC sputtering process using a single crystal Si doped with (P) at about $1 \times 10^{20}$ $cm^{-3}$ is employed. According to the sputtering process, power is about 1 Kw, and a sputtering pressure is about $10^{-4}$ Pa. A doped polysilicon film having a thickness of about 20 nm is formed after about 100 seconds.

(2) PDA is carried out under that condition that the resultant is put in a resistance heat furnace at about 500 to 1200° C. for ten minutes or more to two hours or less, and put in a lamp annealing furnace for about one to 30 seconds. Via the foregoing PDA, densification (high density) of the second insulating film 20 is made; as a result, the film quality is made dense, and modified. The foregoing densification serves to reduce the film thickness about 10%. Thereafter, a photo resist film 24 is coated on the sputtering control gate electrode 32. Then, the coated photo resist film 24 is patterned using photolithography to form a pattern of the photo resist film 24 shown in FIG. 27. Thereafter, using the pattern of the photo resist film 24 as a column cell isolation etching mask, the following films are selectively etched until the silicon substrate 11 is exposed, That is, the films includes the foregoing puttering control gate electrode 32, interlayer insulating film (second insulating film) 20, second conductive layer 19, first conductive layer 13 and gate insulating film (first insulating film) 12. By doing so, a plurality of slit-like cell isolation trenches extending to the row direction (word line direction) is formed. As seen from FIG. 28, a memory cell transistor in the cell column is isolated (the sectional structure shown in FIG. 28 is a section viewing from the A-A direction vertical to the paper of FIG. 27.) Via the cell isolation trench, the control gate electrode (sputtering control gate electrode) 32 and the floating gate electrode (13, 19) of each memory cell transistor of each cell column are isolated. Although no illustration is made, the select transistor is isolated from the memory cell transistor via cell isolation trench in the column direction.

(3) An n-type impurity ion such as arsenic ion ($^{75}As^+$) or phosphorus ion ($^{31}P^+$) is implanted the semiconductor substrate 11 exposed via the cell isolation trench in self-align, as shown in FIG. 23. In this case, the stacked layer structure (12, 13, 19, 20, 22) isolated from each other via the cell isolation trench is used as a mask. Specifically, 12 is the gate insulating film (first insulating film), 13 is the first conductive layer, 19 is the second conductive layer, 20 is the inter-electrode insulating film (second insulating film) and 22 is the control gate electrode (CVD control gate electrode). Before ion implantation, the stacked layer structure is heated at about 800° C. for about 120 seconds in a nitrogen atmosphere, and further, heated at about 1000° C. in an oxidization atmosphere. By doing so, a front-end film comprising a silicon oxide film having a thickness of about 6 nm is formed at the following portions. One is a surface of the semiconductor substrate 11. Another is a sidewall exposed from the cell isolation trench of the stacked layer structure (12, 13, 19, 20, 32). The ion may be implanted via the foregoing front-end film.

(4) After ion implantation, the surface of the semiconductor substrate 11 is formed with a source/drain region 25 via activation annealing, and thereby, each memory cell transistor is configured. A SiOF film is deposited as an interlayer insulating film 26 via an HDP process using diphloro silane gas ($SiH_2F_2$ gas). By doing so, as seen from FIG. 30, the film 26 is filled in a space between memory cell transistors isolated from each other via the cell isolation trench and in a space between the memory cell transistor and the select transistor (not shown). A new photo resist film is coated on the entire surface, and thereafter, a new photo resist film is patterned using a normal photolithography. A via hole (contact hole) is opened between two select transistors via a RIE process using the new photo resist film as an etching mask. A contact plug comprising a conductor such as tungsten is buried in the contact hole using sputtering, vacuum deposition and CVD processes. Further, a metal film (conductor film) is deposited using sputtering, vacuum deposition and CVD processes. Then, the metal film (conductor film) is patterned using photolithography and RIE (or damascene technique). By doing so, the bit line 27 shown in FIG. 25 is wired, and thereby, the semiconductor device according to the first embodiment is completed. In FIG. 25, although no illustration is made, an insulating film such as a silicon nitride film and polyimide film may be formed as a passivation film on the bit line 27. This is the same as the process of manufacturing a normal NAND flash memory.

According to the method of manufacturing the semiconductor device of the second embodiment of the invention, the sputtering control gate electrode 32 is deposited on the inter-electrode insulating film (second insulating film) 20 using a sputtering process. Therefore, it is possible to prevent a generation of damage such as oxygen defect by reducing gas with respect to the inter-electrode insulating film (second insulating film) 20. As described above, the high relative dielectric constant insulating film forming the inter-electrode insulating film (second insulating film) 20 is prevented from being exposed in a reducing gas, and thus, damage before forming a capacitor is prevented. By doing so, when the high relative dielectric constant insulating film is etched after that, even if an etching gas having reduction such as boron trichloride ($BCl_3$) is used, the following advantage is obtained. Specifically, it is possible to prevent a generation of oxygen defect on the etching end face of the high relative dielectric constant insulating film resulting from BO generating during etching.

According to the method of manufacturing the semiconductor device of the second embodiment of the invention, damage is prevented being generated when a conductive layer is deposited on the inter-electrode insulating film (second insulating film) 20. Moreover, it is possible to prevent a generation of damage when a capacitor is formed using etching. Therefore, the method of manufacturing the semiconductor device of the second embodiment has the following advantage. Namely, even if the peripheral length of a capacitor to the capacitor area relatively increases with the scale-down of the non-volatile semiconductor memory device, there is no problem of a damage layer such as oxygen defect.

According to the method of manufacturing the semiconductor device of the second embodiment, a doped polysilicon film is used as the control gate electrode (sputtering control gate electrode) 32. As already described, metal such as Ti or TiN or various conductive material such as metal nitride film are usable as the control gate electrode (sputtering control gate electrode) 32. In also case, the initial layer of the electrode is deposited using a sputtering process to form a film, and thereby, the second insulating film 20 is prevented from being deteriorated.

According to the method of manufacturing the semiconductor device (non-volatile semiconductor memory device) of the second embodiment, a deposition process using sputtering is employed as the process of forming the control gate electrode (sputtering control gate electrode) 32. Vapor deposition, coating and plating processes may be properly selected and used to form a conductive layer forming the control gate electrode (sputtering control gate electrode) 32. Even if the foregoing processes are used, it is possible to prevent the second insulating film 20 from being deteriorated.

Third Embodiment

As described in the second embodiment, the following problem arises if doped polysilicon is used as the top control gate electrode of the inter-electrode insulating film (second insulating film) 20. Namely, if a CVD process using normal $SiH_4$ as a material is employed, a high relative dielectric constant insulating film forming the inter-electrode insulating film (second insulating film) 20 receives damage such as oxygen defect by reduction of $SiH_4$. Moreover, an etching gas having reduction such as $Bcl_3$ is used to etch the high relative dielectric constant insulating film. For this reason, BO is generated during etching, the etched end face of the high relative dielectric constant insulating film has oxygen defect. In order to solve the problem of a damage layer such as oxygen defect with respect to the inter-electrode insulating film (second insulating film) 20, the method of manufacturing the semiconductor device of the second embodiment employs the process. According to the process, the sputtering control gate electrode 32 is deposited on the inter-electrode insulating film (second insulating film) 20 via a sputtering process. By doing so, the inter-electrode insulating film (second insulating film) 20 is prevented from receiving damage such as oxygen defect by reducing gas. In this case, all of the control gate electrode formed on the inter-electrode insulating film (second insulating film) 20 are not always deposited using a sputtering process. The lowermost conductive layer contacting with the inter-electrode insulating film (second insulating film) 20 is formed using a sputtering process, and thereby, the same effect is obtained.

FIG. 31, as like as FIG. 25, is a cross-sectional view to explain a semiconductor device according to a second embodiment of the invention, equivalent to the structure when viewing from the A-A direction of FIG. 2 showing a plan view of a NAND type non-volatile semiconductor memory device (flash memory) of the third embodiment. As shown in the sectional vie of FIG. 31, a semiconductor device according to the third embodiment is formed in the following like the semiconductor device (non-volatile semiconductor memory device) of the first embodiment. A surface of a p-type semiconductor substrate 11 is formed with a source/drain region 25 of a memory cell transistor. A gate insulating film (first insulating film) 12 is formed on a channel region defined between the source/drain regions 25. The source/drain region 25 is an n+type semiconductor region doped with an n type impurity in a p-type semiconductor substrate 11 at high concentration.

The following films are formed on the gate insulating film (first insulating film) 12. One is a floating gate electrode (13, 19) for storing a charge. Another is an inter-electrode insulating film (second insulating film) 20 formed on the floating gate electrode (13, 19). Another is a control gate electrode (33, 34) formed on the inter-electrode insulating film (second insulating film) 20. In this manner, a gate electrode of each memory cell transistor is configured. The control gate electrode (33, 34) differs from the CVD control gate electrode 22 of the semiconductor device of the first embodiment. The control gate electrode (33, 34) is formed having the following two-layer structure. One is a bottom front-end sputtering layer 33 formed on the inter-electrode insulating film (second insulating film) 20 using a sputtering process. Another is a top control gate electrode 34 formed on the bottom front-end sputtering layer 33 using a CVD process. The following materials are used as the front-end sputtering layer 33 formed using a sputtering process in addition to doped polysilicon. For example, metal having high melting point such as W, Co, Ti and Mo, metal silicide film $WSi_2$, $CoSi_2$, $TiSi_2$ and $MoSi_2$, polycide films using these silicide films or metal nitride films such as WN, TiN and $Ti_2N$ or a stacked layer film combining those are given. The following materials are used as the top control gate electrode 34 formed using a CVD process. For example, any of doped polysilicon same as the bottom front-end sputtering layer 33, metals having high melting point, metal silicide films, polycide films and metal nitride film or a stacked layer film combining those are given.

On the other hand, the floating gate electrode (13, 19) used as a charge storage layer is formed having the following two-layer structure, like the semiconductor device of the first embodiment. One is a first conductive layer 13 comprising a doped polysilicon film. Another is a second conductive layer 19 comprising a doped polysilicon film.

The following high relative dielectric constant insulating film is used as the inter-electrode insulating film (second insulating film) 20, like the semiconductor device of the first embodiment. Preferably, the high relative dielectric constant insulating film is larger than a relative dielectric constant of about 3.8 to 4 of a silicon oxide film ($SiO_2$ film). In particular, the high relative dielectric constant insulating film is larger than a relative dielectric constant of about 5 to 5.5 obtained from the conventional ONO film. Various insulating films are usable as the foregoing high relative dielectric constant insulating film.

As is evident from the sectional view along the bit line shown in FIG. 31, the floating gate electrode (13, 19) of each memory cell transistor face via the interlayer insulating film 26 in the semiconductor device of the third embodiment. As described in the first and second embodiments, the interlayer insulating film 26 having a relative dielectric constant ∈$_r$ lower than about 3.9 is filled between the floating gate electrodes (13, 19) of a plurality of memory cell transistors arrayed in the column direction. By doing so, it is possible to prevent write error resulting from column direction proximity cell interference occurring between neighboring memory cell transistors in the column direction in the same column. As described in the first and second embodiments, a cell isolation front-end film comprising a silicon oxide film having a thickness of about 6 nm may be formed at a sidewall of a stacked-layer structure (13, 19, 20, 32) comprising the following films. That is, 13 is the first polysilicon film (first conductive layer), 19 is the second polysilicon film (first conductive layer), 20 is the inter-electrode insulating film (second insulating film) and 32 is the control gate electrode (sputtering control gate electrode). A two-layer structure of the interlayer insulating film 26 and a core filling insulating film may be used between select transistors in the cell column adjacent to the row direction. A contact plug is buried through the center portion of the core filling insulating film. The contact plug has a low resistance, and has ohmic-contact with a bit line contact region (not shown). The contact plug is connected to the bit line (BL$_{2j}$) 27 formed on the interlayer insulating film 26. In FIG. 31, the bit line 27 is formed on the interlayer insulating film 26. In this case, the interlayer insulating film 26 is formed with a damascene trench, and metal interconnect consisting of mainly copper (Cu) is buried in the damascene trench. By doing so, a damascene interconnection is given.

In the semiconductor device (non-volatile semiconductor memory device) according to the third embodiment of the invention, the control gate electrode (33, 34) is formed having the follow two-layer structure. One is a bottom front-end sputtering layer 33 formed on the inter-electrode insulating film (second insulating film) 20 using a sputtering process. Another is a top control gate electrode 334 formed on the front-end sputtering layer 33 using a CVD process. Therefore, this serves to prevent a generation of damage such as oxygen defect by reducing gas with respect to the inter-electrode insulating film (second insulating film) 20.

As described above, a charge stored in a capacitor is proportional to an area of the capacitor, that is, square of one side length of the capacitor. On the other hand, an area of the damage layer is proportional to a peripheral length of a capacitor, that is, one side length of the capacitor. However, the semiconductor device (non-volatile semiconductor memory device) according to the third embodiment of the invention has the following advantage. Specifically, even if the peripheral length of the capacitor to the capacitor area relatively increases with the scale-down of the non-volatile semiconductor memory device, there is no problem of the damage layer such as oxygen defect.

Figure 34:
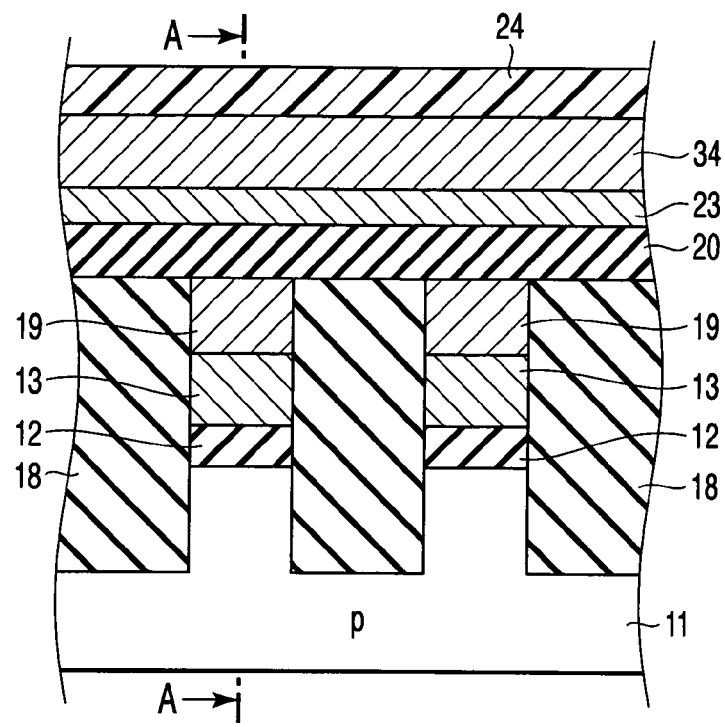
FIG. 34 is a process sectional view to explain the method of manufacturing the semiconductor device according to the third embodiment of the present invention.
Figure 35:
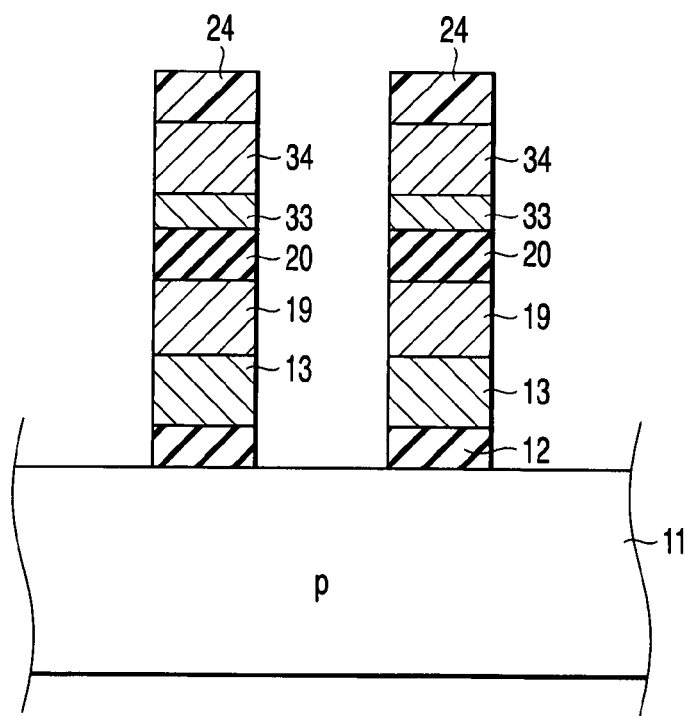
FIG. 35 is a process sectional view to explain the method of manufacturing the semiconductor device according to the third embodiment of the present invention.

A method of manufacturing the semiconductor device according to the third embodiment of the invention will be hereinafter described with reference to FIG. 32 to FIG. 37. FIG. 32 and FIG. 34 are cross-sectional views parallel to word lines WL1$_k$, WL2$_k$, ... WL32$_k$, WL1$_{k-1}$, shown in FIG. 2, and cutting a specific word line. FIG. 35 to FIG. 37 is a cross-sectional view parallel to the bit lines BL$_{2j-1}$, BL$_{2j}$, BL$_{2j+1}$, ... corresponding to the A-A direction of FIG. 2. In this case, the inter-electrode insulating film (second insulating film) 20 is not limited to the Hf$_x$Al$_{1-x}$O$_y$ film. For convenience, an explanation is made using the Hf$_x$Al$_{1-x}$O$_y$ film as the inter-electrode insulating film (second insulating film) 20. In the following method of manufacturing the semiconductor device of the third embodiment, an overlapping explanation with the method of manufacturing the semiconductor device of the first embodiment is omitted.

In FIG. 32, a process until the Hf$_x$Al$_{1-x}$O$_y$ film as the second insulating film 20 is formed on the pattern of the planarized second conductive layer 19 is the same as the process described using FIG. 13 to FIG. 18 of the first embodiment. Like the method of manufacturing the semiconductor device according to the first and second embodiments, the following method of manufacturing the semiconductor device according to the third embodiment is one example. Of course, including modification examples, the semiconductor device is realizable according to various manufacturing methods excepting this.

(1) Via a series of the process described in FIG. 13 to FIG. 17 of the first embodiment, the second conductive layer 19p comprising polysilicon shown in FIG. 18 is deposited on a trench obtained after removing the silicon nitride film 14 of FIG. 17. The second conductive layer 19p is a conductive layer functioning as part of the floating gate electrode (13, 19) shown in FIG. 31 in the method of manufacturing the semiconductor device according to the third embodiment. Then, the second conductive layer 19p is planarized via CMP using a buried insulating film 18 as a stopper. A pattern of the second conductive layer 19p is filled in a trench formed after removing the silicon nitride film 14.

(2) Thereafter, as depicted in FIG. 32, a front-end sputtering layer 33 functioning as part of the control gate electrode (33, 34) is formed on the second insulating film 20 using a sputtering process. According to the method of manufacturing the semiconductor device of the third embodiment, a doped polysilicon film is used as the front-end sputtering layer 33. The doped polysilicon film used as the front-end sputtering layer 33 is formed in the following manner. Specifically, phosphorus (P) is used as a target, and a DC sputtering process using a single crystal Si doped with (P) at about $1 \times 10^{20}$ cm$^{-3}$ is employed. According to the sputtering process, power is about 1 Kw, and a sputtering pressure is about $10^{-4}$ Pa. A doped polysilicon film having a thickness of about 20 nm is formed after about 100 seconds.

(3) As seen from FIG. 33, the doped polysilicon film is deposited on the front-end sputtering layer 33 via a low pressure CVD process using monosilane (SiH$_4$) and phosfin (PH$_3$). By doing so, the top control gate electrode 34 functioning as another part of the control gate electrode (33, 34) is formed. The total thickness of the front-end sputtering layer 33 and the top control gate electrode 34 is set to about 30 to 200 nm. The stacked layer structure of the front-end sputtering layer 33 and the top control gate electrode 34 is formed. Thereafter, PDA is carried out under that condition that the resultant is put in a resistance heat furnace at about 500 to 1200° C. for about ten minutes or more to two hours or less, and put in a lamp annealing furnace for about one to 30 seconds. Via the foregoing PDA, densification (high density) of the second insulating film 20 is made; as a result, the film quality is made dense, and modified. The foregoing densification serves to reduce the film thickness about 10%.

(4) Thereafter, a photo resist film 24 is coated on the top control gate electrode 34. Then, the coated photo resist film 24 is patterned using photolithography to form a pattern of the photo resist film 24 shown in FIG. 34. Thereafter, using the pattern of the photo resist film 24 as a column cell isolation etching mask, the following films are selectively etched until the silicon substrate 11 is exposed. That is, the films includes the foregoing top control gate electrode 34, front-ened sputtering layer 33, interlayer insulating film (second insulating film) 20, second conductive layer 19, first conductive layer 13 and gate insulating film (first insulating film) 12. By doing so, a plurality of slit-like cell isolation trenches extending to the row direction (word line direction) is formed. As seen from FIG. 35, a memory cell transistor in the cell column is isolated (the sectional structure shown in FIG. 35 is a section viewing from the A-A direction vertical to the paper of FIG. 34.) Via the cell isolation trench, the control gate electrode (33, 34) and the floating gate electrode (13, 19) of each memory cell transistor of each cell column are isolated. Although no illustration is made, the select transistor is isolated from the memory cell transistor via cell isolation trench in the column direction.

(5) An n-type impurity ion such as arsenic ion ($^{75}As^+$) or phosphorus ion ($^{31}P^+$) is implanted the semiconductor substrate 11 exposed via the cell isolation trench in self-align, as shown in FIG. 23. In this case, the stacked layer structure (12, 13, 19, 20, 33, 34) isolated from each other via the cell isolation trench is used as a mask. Specifically, 12 is the gate insulating film (first insulating film), 13 is the first conductive layer, 19 is the second conductive layer, 20 is the inter-electrode insulating film (second insulating film), 33 is the front-end sputtering layer, and 34 is the top control gate electrode. Before ion implantation, the stacked layer structure is heated at about 800° C. for about 120 seconds in a nitrogen atmosphere, and further, heated at about 1000° C. in an oxidization atmosphere. By doing so, a front-end film comprising a silicon oxide film having a thickness of about 6 nm is formed at the following portions. One is a surface of the semiconductor substrate 11. Another is a sidewall exposed from the cell isolation trench of the stacked layer structure (12, 13, 19, 20, 33, 34). The ion may be implanted via the foregoing front-end film.

(6) After ion implantation, the surface of the semiconductor substrate 11 is formed with a source/drain region 25 via activation annealing, and thereby, each memory cell transistor is configured. A SiOF film is deposited as an interlayer insulating film 26 via an HDP process using diphloro silane gas ($SiH_2F_2$ gas). By doing so, as seen from FIG. 37, the film 26 is filled in a space between memory cell transistors isolated from each other via the cell isolation trench and in a space between the memory cell transistor and the select transistor (not shown). A new photo resist film is coated on the entire surface, and thereafter, a new photo resist film is patterned using a normal photolithography. A via hole (contact hole) is opened between two select transistors via a RIE process using the new photo resist film as an etching mask. A contact plug comprising a conductor such as tungsten is buried in the contact hole using sputtering, vacuum deposition and CVD processes. Further, a metal film (conductor film) is deposited using sputtering, vacuum deposition and CVD processes. Then, the metal film (conductor film) is patterned using photolithography and RIE (or damascene technique). By doing so, the bit line 27 shown in FIG. 31 is wired, and thereby, the semiconductor device according to the third embodiment is completed. In FIG. 31, although no illustration is made, an insulating film such as a silicon nitride film and polyimide film may be formed as a passivation film on the bit line 27. This is the same as the process of manufacturing a normal NAND flash memory.

According to the method of manufacturing the semiconductor device of the third embodiment of the invention, the front-end sputtering layer 33 is deposited on the inter-electrode insulating film (second insulating film) 20 using a sputtering process. Further, the top control gate electrode 34 is deposited on the front-end sputtering layer 33 using a CVD process. Therefore, it is possible to prevent a generation of damage such as oxygen defect by reducing gas with respect to the inter-electrode insulating film (second insulating film) 20. As described above, the high relative dielectric constant insulating film forming the inter-electrode insulating film (second insulating film) 20 is prevented from being exposed in a reducing gas, and thus, damage before forming a capacitor is prevented. By doing so, when the high relative dielectric constant insulating film is etched after that, even if an etching gas having reduction such as boron trichloride ($BCl_3$) is used, the following advantage is obtained. Specifically, it is possible to prevent a generation of oxygen defect on the etching end face of the high relative dielectric constant insulating film resulting from BO generating during etching.

According to the method of manufacturing the semiconductor device of the third embodiment of the invention, damage is prevented being generated when a conductive layer is deposited on the inter-electrode insulating film (second insulating film) 20. Moreover, it is possible to prevent a generation of damage when a capacitor is formed using etching. Therefore, the method of manufacturing the semiconductor device of the third embodiment has the following advantage. Namely, even if the peripheral length of a capacitor to the capacitor area relatively increases with the scale-down of the non-volatile semiconductor memory device, there is no problem of a damage layer such as oxygen defect.

According to the method of manufacturing the semiconductor device of the third embodiment, a doped polysilicon film is used as the control gate electrode (33, 34). As already described, metal such as Ti or TiN or various conductive materials such as metal nitride film are usable as the control gate electrode (33, 34). In also case, the initial layer of the electrode is deposited using a sputtering process to form a film, and thereby, the second insulating film 20 is prevented from being deteriorated.

According to the method of manufacturing the semiconductor device (non-volatile semiconductor memory device) of the third embodiment, a deposition process using sputtering is employed as the process of forming the control gate electrode (33, 34). Vapor deposition, coating and plating processes may be properly selected and used to form a conductive layer forming the control gate electrode (33, 34). Even if the foregoing processes are used, it is possible to prevent the second insulating film 20 from being deteriorated.

Fourth Embodiment

In the first embodiment, a single-layer HfAlO film is used as the inter-electrode insulating film. A leak current is restricted by controlling the Hf concentration of the HfAlO film, and the effect is given less than the film thickness of the grain size. Thus, if the Hf concentration is more than about 80%, a structure using the HfAlO film having a thickness less than about 30 nm is given. In this case, if the HfAlO film is used together with a silicon oxide film and a silicon nitride film, the leak current is reduced. If the film thickness becomes more than the grain size, a low relative dielectric constant (low-k) grain boundary layer is attacked in the film thickness direction. If the stacked layer structure is given, an average relative dielectric constant is subjected by mainly a low relative dielectric constant layer. Therefore, a high relative dielectric constant is not obtained. The fourth embodiments will be hereinafter described giving an inter-electrode insulating film stacked with other insulating film as an example.

Figure 38:
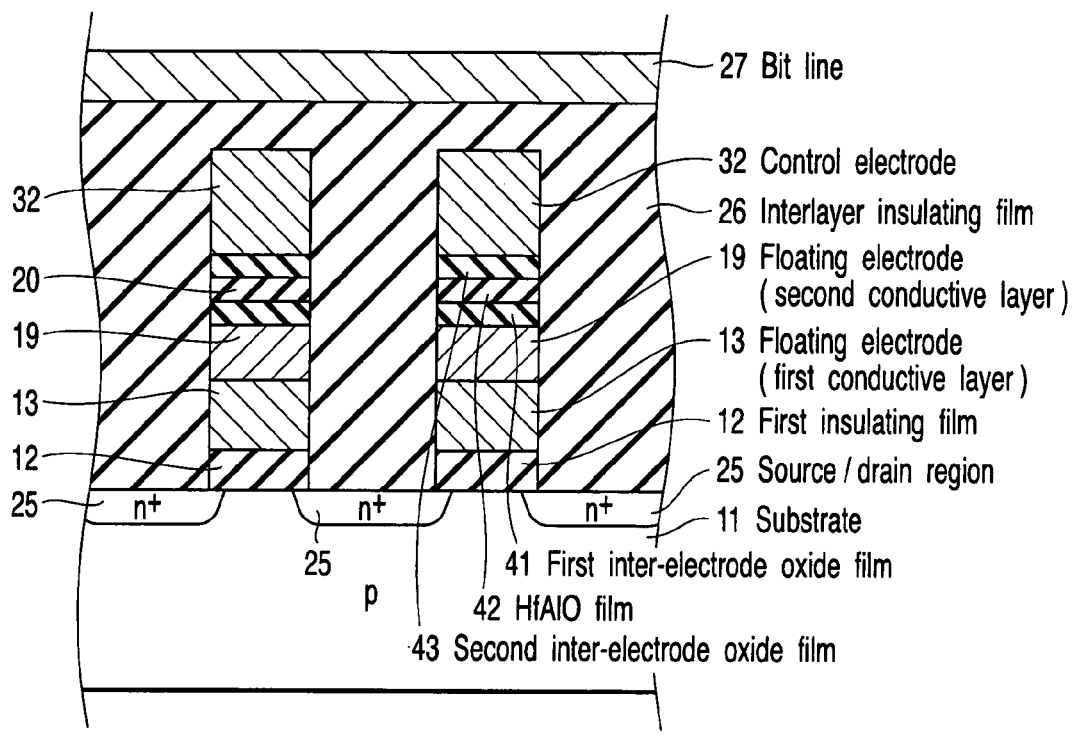
FIG. 38 is a cross-sectional view cut along a bit line direction (A-A direction) of FIG. 2, and showing part (NAND cell column) of a memory cell array of a semiconductor device (non-volatile semiconductor memory device) according to a fourth embodiment of the present invention.

As shown in FIG. 38, an inter-electrode insulating film is formed of a stacked layer film comprising a first silicon nitride film 41, a HfAlO film 42 and a second silicon nitride film 43 formed on the HfAlo film 42. The HfAlO film 42 is a high relative dielectric constant insulating film formed on the first silicon nitride film 41. The foregoing stacked layer structure is given, and thereby, the insulation of the inter-electrode insulating film is largely improved. As a result, it is possible to realize sufficient memory hold operation, to prevent memory malfunction, and to realize a sufficient memory operating speed. Moreover, variations of a coupling ratio of the memory cell are prevented; therefore, variations of memory cell characteristic are greatly reduced. The silicon nitride film can effectively prevent diffusion of an oxidizing agent. This serves to prevent bird's beak oxidization occurring in the interface of the inter-electrode insulating film and the control gate and the interface of the same and the floating electrode when oxidizing the electrode sidewall after forming the electrode. A method of forming the inter-electrode insulating film will be hereinafter described. After the process shown in FIG. 18, the exposed surface of the polysilicon film (floating gate electrode) 19 and the silicon oxide film (isolation film) 18 is formed with a first silicon nitride film 41 having a thickness about 0.5 to 10 nm using radical nitrizing process. Then, the HfAlO film 42 is deposited as a high relative dielectric constant insulating film on the surface of the first silicon nitride film 41 using an ALD process. The thickness of the HfAlO film 42 has a range from one atomic layer thickness or more and about 10 nm or less. In this case, the Hf composition is used at about 93%. The second silicon nitride film 43 having a thickness of about 0.5 to 10 nm is deposited on the surface of the HfAlO film 42 using a CVD process. By doing so, there is formed an inter-electrode insulating film comprising a stacked layer of a silicon nitride film, a silicon oxide film, a HfAlO film, a silicon oxide film and a silicon nitride film. The process after that is the same as FIG. 20 after that.

As described above, the inter-electrode insulating film has a stacked layer structure comprising the fist silicon nitride film, the HfAlO film and the second silicon nitride film. By doing so, the following two effects are simultaneously obtained. Namely, the leak current is reduced, and bird's beak is prevented from being formed.

Figure 39:
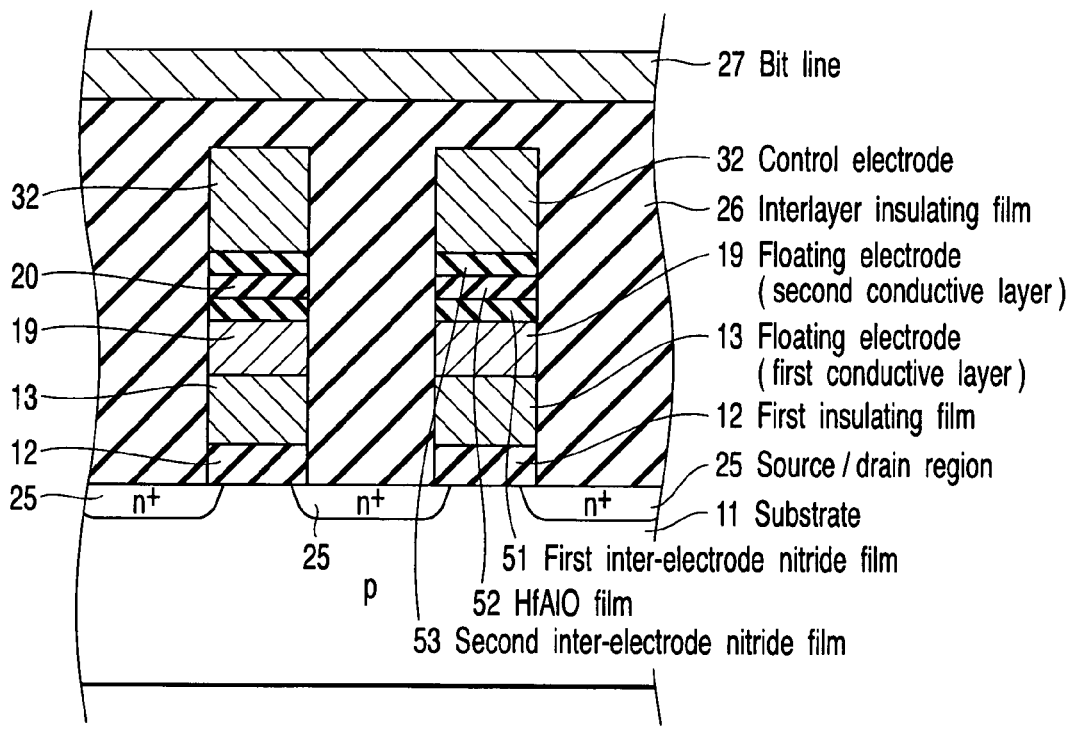
FIG. 39 is a cross-sectional view cut along a bit line direction (A-A direction) of FIG. 2, and showing part (NAND cell column) of a memory cell array of a semiconductor device (non-volatile semiconductor memory device) according to a fourth embodiment of the present invention.

As illustrated in FIG. 39, an inter-electrode insulating film is formed of a stacked layer film comprising a first silicon oxide film 51, a HfAlO film 52 and a second silicon oxide film 53 formed on the HfAlO film 52. The HfAlO film 52 is a high relative dielectric constant insulating film formed on the first silicon oxide film 51. Silicon oxide films 41 and 43 having barrier height higher than the high relative dielectric constant insulating film 52 are formed. By doing so, it is possible to effectively reduce a leak current when a low electric filed is applied to the inter-electrode insulating film in memory hold time. The first silicon oxide film is effective to holding a threshold value of a write cell. The second silicon oxide film is effective to holding a threshold value of an erase cell. Moreover, the second silicon oxide film is formed, and thereby, oxygen defect in the high relative dielectric constant insulating film resulting from a reducing atmosphere (e.g., silane gas ($SIH_4$ gas)) when a control gate electrode is formed is reduced. As a result, a leak current is reduced.

A method of forming the inter-electrode insulating film will be hereinafter descried. After the process shown in FIG. 18, a first silicon oxide film 51 having a thickness of about 1 to 5 nm is deposited on the exposed surface of the polysilicon film (floating gate electrode film) 19 and the silicon oxide film (isolation film) 18. A HfAlO film 52 is deposited as a high relative dielectric constant insulating film on the surface of the first silicon oxide film 51 using an ALD process. The thickness of the HfAlO film 52 has a range from one atomic layer thickness or more and about 10 nm or less. In this case, the Hf composition is made at about 93%. A second silicon oxide film 53 having a thickness of about 1 to 5 nm is deposited on the surface of the HfAlO film 52 using a CVD process. By doing so, there is formed an inter-electrode insulating film comprising a stacked layer of a silicon oxide film, a HfAlO film and a silicon oxide film. The process after that is the same as FIG. 20 after that.

As described above, the inter-electrode insulating film has a stacked layer structure comprising the fist silicon oxide film, the HfAlO film and the second silicon oxide film. By doing so, the following effects are simultaneously obtained. Namely, the leak current is reduced, a reducing agent is prevented, and bird's beak is prevented from being formed.

Figure 40:
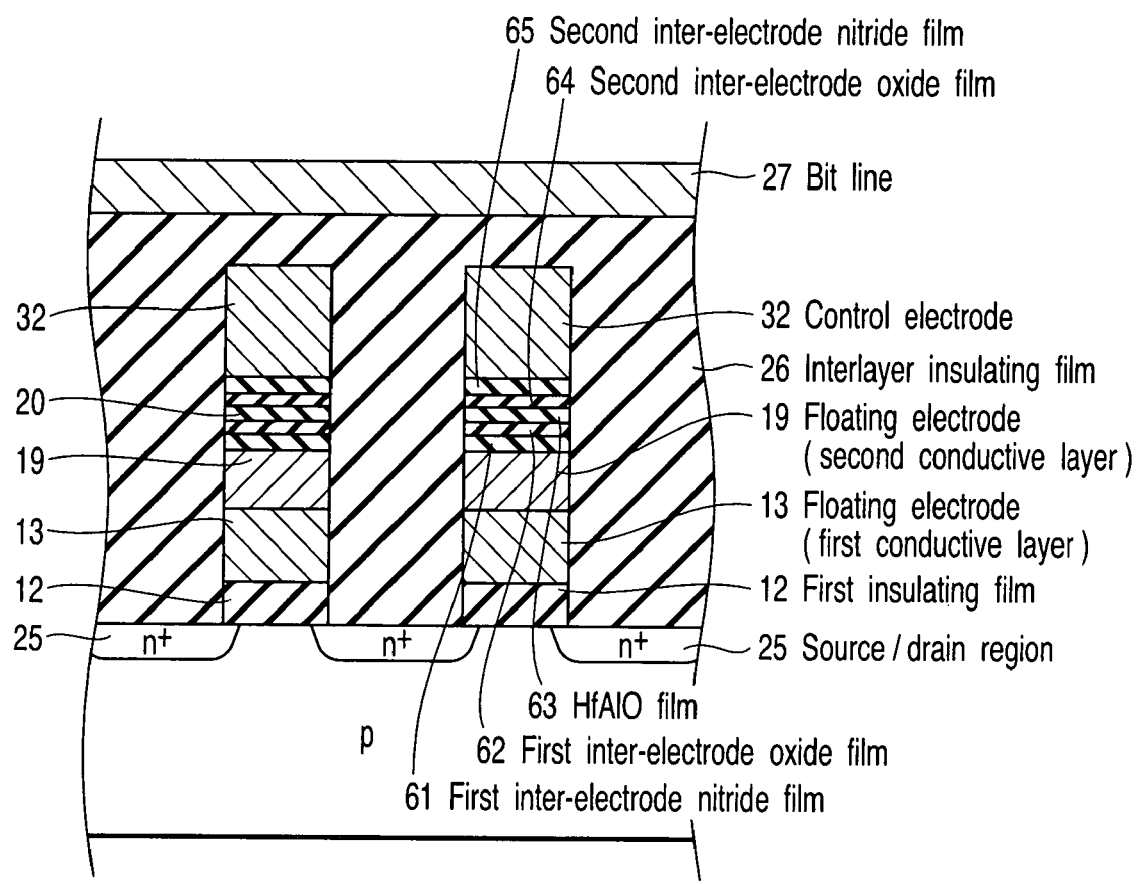
FIG. 40 is a cross-sectional view cut along a bit line direction (A-A direction) of FIG. 2, and showing part (NAND cell column) of a memory cell array of a semiconductor device (non-volatile semiconductor memory device) according to a fourth embodiment of the present invention.

As depicted in FIG. 40, an inter-electrode insulating film is formed of a stacked layer film comprising a first silicon nitride film, a first silicon oxide film, a HfAlO film a second silicon oxide film and a second nitride film. As described above, the silicon nitride film serves to prevent bird's beak generated in the interface of the inter-electrode insulating film and the control gate electrode and the interface of the same and the floating gate electrode when the electrode sidewall is oxidized. The silicon oxide film has barrier height high than the high relative dielectric constant insulating film 52. Oxygen defect in the high relative dielectric constant insulating film resulting from a reducing atmosphere (e.g., silane gas ($SIH_4$ gas)) when a control gate electrode is formed is reduced. As a result, a leak current is reduced. A method of forming the inter-electrode insulating film will be hereinafter described.

After the process shown in FIG. 18, a first silicon nitride film 61 having a thickness about 0.5 to 10 nm is formed on the exposed surface of the polysilicon (floating gate electrode film) 19 and the silicon oxide film (isolation insulating film) 18 using radical nitrizing. A first silicon oxide film 62 having a thickness about 1 to 5 nm is deposited on the surface of the first silicon nitride film 61 using a CVD process. An HfAlO film 63 is deposited as a high relative dielectric constant insulating film on the surface of the first silicon oxide film 62 using an ALD process. The thickness of the HfAlO film 63 has a range from one atomic layer thickness or more and about 5 nm or less. In this case, the Hf composition is made at about 93%. A second silicon oxide film 64 having a thickness of about 1 to 5 nm is deposited on the surface of the HfAlO film 63 using a CVD process. A second silicon nitride film 65 having a thickness of about 0.5 to 10 nm is further deposited on the second silicon oxide film 64 using a CVD process. By doing so, there is formed an inter-electrode insulating film comprising a stacked layer of the silicon nitride film, silicon oxide film, the HfAlO film, the silicon oxide film and the silicon nitride film. The process after that is the same as FIG. 20 after that.

As described above, the inter-electrode insulating film has a stacked layer structure comprising the first silicon nitride film, the first silicon oxide film, the HfAlO film, the second silicon oxide film and the second nitride film. By doing so, the following effects are simultaneously obtained. Namely, the leak current is reduced, a reducing agent is prevented, and bird's beak is prevented from being formed.

In particular, when a FG channel length becomes less than about 50 nm, cell interference is large. For this reason, the height of FG must be secured in some degree. Resulting from above, an electric field applied to IPD becomes high; for this reason, the leak current of he IPD must be reduced. Therefore, the foregoing structure is effective.

The specification of the leak current of the IPD determines depending on a leak current ratio to a tunnel insulating film. In order to reduce the leak current of the IPD with respect to a constant leak current of the tunnel insulating film, an electric filed applied to the IPD must be reduced. In order to perform this, the relative dielectric constant of the tunnel insulating film is set smaller than that of the IPD. A film having a relative dielectric constant (less than about 7) smaller than SiN is convenient as the material of the tunnel insulating film.

Other Embodiments

As described above, a NAND type flash memory is given as one example of the semiconductor device. The NAND type flash memory and the method of manufacturing the same have been described in the first to fourth embodiments of the present invention. The present invention is not limited to descriptions and drawings given as part of disclosure. In this case, the present invention is applicable to an AND type flash memory and a DINOR type flash memory in addition to the NAND type flash memory. Moreover, the present invention is applicable to other various semiconductor memory devices such as DRAM and SRAM. From the foregoing disclosure, it is obvious to persons skilled in the art to understand various alternative modes, embodiments and techniques.

For example, in the same structure as a 1-cell 1-transistor type DRAM, a ferroelectric memory using a high relative dielectric constant insulating film as a capacitor insulating film of the storage capacitor is given. In this case, the floating gate electrode of the non-volatile semiconductor memory device described in the first to fourth embodiments is used as a storage electrode (bottom electrode) connected to a drain region of a switching transistor. Further, the control gate electrode of the non-volatile semiconductor memory device is used as a top electrode connected to a plate electrode. By doing so, it can be readily seen that a leak current flowing through the capacitor insulating film is reduced in the same manner as described in the first to fourth embodiments. In this case, according to the second and third embodiments, the top electrode connected to the plate electrode of the ferroelectric memory is formed in such a manner that the initial layer connecting with the high relative dielectric constant insulating film is deposited using a sputtering process. By doing so, the capacitor insulating film of the ferroelectric memory I prevented from being deteriorated.

As seen from data shown in FIG. 6, FIG. 8 and FIG. 9, a MOS capacitor using a high relative dielectric constant insulating film as the capacitor insulating film is fundamental of the present invention. Therefore, the present invention is applicable to various insulating gate type transistors using the MOS capacitor. An insulating gate structure electrostatically controlling a carrier flowing through a channel is usable in the following films and semiconductor devices. One of the films is a gate insulating film (first insulating film) of a memory cell transistor of a non-volatile semiconductor memory device. Another is a gate insulating film of a switching transistor of a DRAM. One of the semiconductor devices is an insulating gate type transistor given as super high-speed switching element of a logic integrated circuit. Another is an insulating gate type transistor operating in a high frequency band such as terahertz. In particular, in an insulating gate structure having a gate length of about 60 nm or less, the field strength of the high relative dielectric constant insulating film used as the gate insulating film becomes large. Thus, the structure and the manufacturing method of the present invention serve to reduce a leak current flowing through the gate insulating film. In this case, according to the second and third embodiments, the gate electrode just on the gate insulating film comprising the high relative dielectric constant insulating film is formed in the following manner. Namely, the initial layer contacting with the high relative dielectric constant insulating film is deposited using a sputtering process. By doing so, the gate insulating film is prevented from being deteriorated.

Of course, the present invention includes various embodiments, which are not described. Therefore, the technical scope of the present invention is determined by only inventive specific matters within the scope of claims properly given from the foregoing description.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a plurality of memory cell transistors,
   each memory cell transistor including:
   a floating gate electrode isolated from each other via an isolation insulating film every memory cell transistor;
   an inter-electrode insulating film comprising a $Hf_xAl_{1-x}O_y$ film ($0.8 \leq x \leq 0.95$) formed above the floating gate electrode; and
   a control gate electrode formed above the inter-electrode insulating film,
   wherein the memory cell transistors are arrayed to form a memory cell array, and
   an average grain size of a crystal grain contained in the $Hf_xAl_{1-x}O_y$ film of the inter-electrode insulating film is more than 10 nm.

2. The device according to claim 1, wherein part of the inter-electrode insulating film is formed using a $Hf_xAl_{1-x}O_y$ film having a thickness of 30 nm or less, and a Hf concentration of the $Hf_xAl_{1-x}O_y$ film is more than 80%.

3. The device according to claim 1, wherein the inter-electrode insulating film is formed of a stacked layer film of a silicon nitride film and a $Hf_xAl_{1-x}O_y$ film.

4. The device according to claim 1, wherein the inter-electrode insulating film is formed of a stacked layer film of a $Hf_xAl_{1-x}O_y$ film and a silicon oxide film having a barrier height higher than the $Hf_xAl_{1-x}O_y$ film.

5. The device according to claim 1, wherein the inter-electrode insulating film is formed of a stacked layer film of a silicon nitride film, a $Hf_xAl_{1-x}O_y$ film and a silicon oxide film having a barrier height higher than the $Hf_xAl_{1-x}O_y$ film.

6. The device according to claim 1, further comprising:
   a tunnel insulating film below the floating gate electrode, and having a relative dielectric constant smaller than the inter-electrode insulating film.

7. The device according to claim 1, further comprising:
   a tunnel insulating film below the floating gate electrode, and having a relative dielectric constant less than 7.

8. A semiconductor device including a memory cell array having a plurality of arrayed memory cells,
   each memory cell including:
   a switching transistor; and
   a storage capacitor comprising a bottom electrode connected to a drain region of the switching transistor, a capacitor insulating film including a $Hf_xAl_{1-x}O_y$ film ($0.8 \leq x \leq 0.95$) formed above the bottom electrode, and a top electrode formed above the capacitor insulating film and connected to a plate electrodes,
   wherein an average grain size of a crystal grain contained in the $Hf_xAl_{1-x}O_y$ film of the capacitor insulating film is more than 10 nm.

9. The device according to claim 8, wherein the $Hf_xAl_{1-x}O_y$ film has a thickness of 30 nm or less, and a Hf concentration of the $Hf_xAl_{1-x}O_y$ film is more than 80%.

10. The device according to claim 8, further comprising:
a silicon nitride film provided between at least one of the bottom and top electrodes and the $Hf_xAl_{1-x}O_y$ film.

11. The device according to claim 8, further comprising:
a silicon oxide film having a barrier height higher than the $Hf_xAl_{1-x}O_y$ film between at least one of the bottom and top electrodes and the $Hf_xAl_{1-x}O_y$ film.

12. The device according to claim 8, further comprising:
a silicon oxide film having a barrier height higher than a silicon nitride film and the $Hf_xAl_{1-x}O_y$ film between at least one of the bottom and top electrodes and the $Hf_xAl_{1-x}O_y$ film.

* * * * *

UNITED STATES PATENT AND TRADEMARK OFFICE
CERTIFICATE OF CORRECTION

PATENT NO. : 7,714,373 B2
APPLICATION NO. : 11/822437
DATED : May 11, 2010
INVENTOR(S) : Natori et al.

Page 1 of 1

It is certified that error appears in the above-identified patent and that said Letters Patent is hereby corrected as shown below:

Claim 8, column 30, line 61, change "plate electrodes," to --plate electrode,--.

Signed and Sealed this

Sixth Day of July, 2010

David J. Kappos
*Director of the United States Patent and Trademark Office*